US011915776B2

(12) United States Patent
Sheperek et al.

(10) Patent No.: US 11,915,776 B2
(45) Date of Patent: *Feb. 27, 2024

(54) ERROR AVOIDANCE BASED ON VOLTAGE DISTRIBUTION PARAMETERS OF BLOCK FAMILIES

(71) Applicant: MICRON TECHNOLOGY, INC., Boise, ID (US)

(72) Inventors: Michael Sheperek, Longmont, CO (US); Kishore Kumar Muchherla, San Jose, CA (US); Shane Nowell, Boise, ID (US); Mustafa N Kaynak, San Diego, CA (US); Larry J Koudele, Erie, CO (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/943,123

(22) Filed: Sep. 12, 2022

(65) Prior Publication Data
US 2023/0012855 A1 Jan. 19, 2023

Related U.S. Application Data

(63) Continuation of application No. 17/217,780, filed on Mar. 30, 2021, now Pat. No. 11,443,830.

(51) Int. Cl.
*G11C 29/00* (2006.01)
*G11C 16/26* (2006.01)
*G11C 29/56* (2006.01)

(52) U.S. Cl.
CPC ........ *G11C 29/56008* (2013.01); *G11C 16/26* (2013.01)

(58) Field of Classification Search
None
See application file for complete search history.

(56) References Cited

U.S. PATENT DOCUMENTS

| 9,633,740 | B1 | 4/2017 | Alhussien et al. |
| 9,921,749 | B2 | 3/2018 | Kim et al. |
| 11,222,704 | B1 | 1/2022 | Rayaprolu |
| 11,263,134 | B1 | 3/2022 | Sheperek et al. |
| 11,443,830 | B1 * | 9/2022 | Sheperek ............. G11C 16/349 |

(Continued)

*Primary Examiner* — Tan T. Nguyen
(74) *Attorney, Agent, or Firm* — Lowenstein Sandler LLP

(57) ABSTRACT

A method can include receiving a request to read data from a block of a memory device, identifying a block family associated with the block of the memory device, identifying a voltage distribution parameter value associated with the block family, wherein the voltage distribution parameter value reflects an aggregate value of a corresponding voltage distribution associated with a plurality of memory cells of the block family, and determining a set of read levels associated with the voltage distribution parameter value, wherein each read level in the set of read levels corresponds to a respective voltage distribution of at least one memory cell comprised by the block of the memory device. The block family can be identified using a data structure that maps block identifiers to corresponding block family identifiers. The voltage distribution parameter value can be identified using a data structure that maps block family identifiers to corresponding voltage parameter values.

20 Claims, 13 Drawing Sheets

(56) References Cited

U.S. PATENT DOCUMENTS

| | | | |
|---|---|---|---|
| 2009/0319868 A1* | 12/2009 | Sharon | G11C 16/26 714/763 |
| 2014/0026003 A1* | 1/2014 | Chen | G11C 29/021 714/708 |
| 2017/0271031 A1 | 9/2017 | Sharon et al. | |
| 2017/0358346 A1 | 12/2017 | Zhang | |
| 2020/0058359 A1 | 2/2020 | Lee | |
| 2020/0098438 A1 | 3/2020 | Lu | |
| 2021/0193231 A1 | 6/2021 | Luo et al. | |
| 2022/0084596 A1 | 3/2022 | Sheperek et al. | |
| 2022/0100413 A1 | 3/2022 | Kim | |

* cited by examiner

ERROR AVOIDANCE BASED ON VOLTAGE DISTRIBUTION PARAMETERS OF BLOCK FAMILIES

RELATED APPLICATION

This application is a continuation of U.S. patent application Ser. No. 17/217,780, filed Mar. 30, 2021, the entire contents of which are incorporated by reference herein.

TECHNICAL FIELD

Embodiments of the disclosure relate generally to memory sub-systems, and more specifically, relate to error avoidance using features of voltage distributions.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
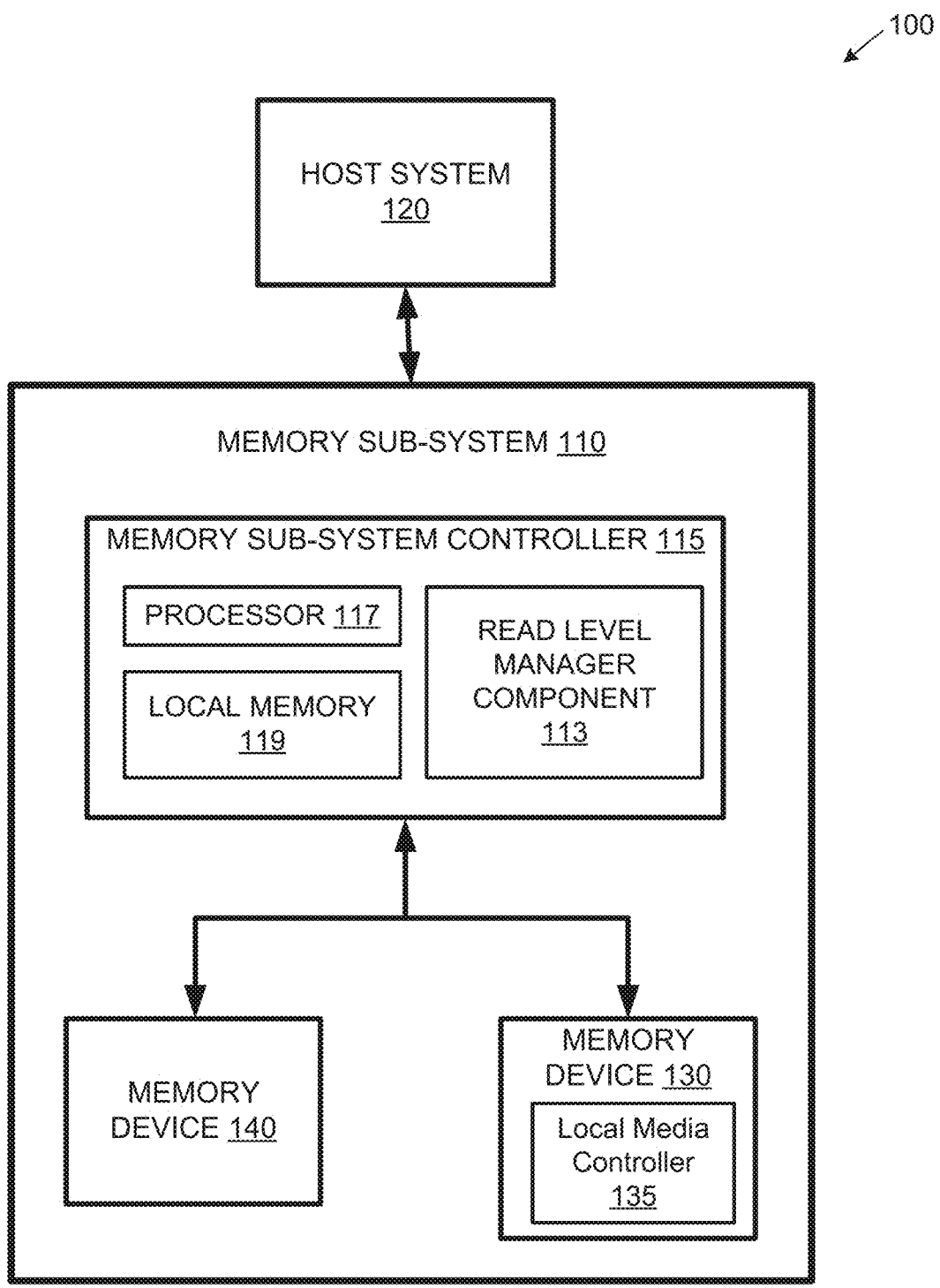
FIG. 1 illustrates an example computing system that includes a memory sub-system in accordance with some embodiments of the present disclosure.

Aspects of the present disclosure are directed to error avoidance in memory devices using voltage distribution parameters, such as a voltage that corresponds to a voltage distribution and changes over time as the voltage distribution changes due to slow charge loss. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dice. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data." A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., error correction code (ECC), parity data), data version (e.g. used to distinguish age of data written), valid bitmap (which LBAs or logical transfer units contain valid data), etc.

A memory device includes multiple memory cells, each of which can store, depending on the memory: cell type, one or more bits of information. A memory cell can be programmed (written to) by applying a certain voltage to the memory cell, which results in an electric charge being held by the memory cell, thus allowing modulation of the voltage distributions produced by the memory cell. Moreover, precisely controlling the amount of the electric charge stored by the memory cell allows multiple threshold voltage levels to be used, corresponding to different logical levels. Multiple threshold levels allow a single memory cell to store multiple bits of information: a memory cell operated with $2^n$ different threshold voltage levels is capable of storing n bits of information. Thus, a read operation can be performed by comparing the measured voltage exhibited by the memory cell to one or more threshold voltage levels in order to distinguish between two logical levels for single-level cells and between multiple logical levels for multi-level cells.

"Block" herein shall refer to a set of contiguous or non-contiguous memory pages. An example of "block" is "erasable block," which is the minimal erasable unit of memory, while "page" is a minimal writable unit of memory. Each page includes of a set of memory cells. A memory cell is an electronic circuit that stores information. "Superblock" herein shall refer to a set of blocks that span multiple die that are written in an interleaved fashion. In some cases, a superblock can span all the die within a storage device such as an SSD. A superblock can contain multiple blocks from a single die, such as one per plane. Drives can generally manage the erasure and programming of data on a superblock basis.

"Read level" herein shall refer to a voltage position. Read levels are numbered in increasing voltage from L1 through $2^n$, wherein n is the number of bits that can be stored in the cell. As an example, for triple level cells (TLC) corresponding to 3 bits per cell, there can be 8 threshold distributions (levels), and 7 read thresholds (read threshold voltages) can be used to differentiate between the levels. "Read level value" herein shall refer to a voltage or Digital-to-Audio Converter (DAC) value representing a voltage that is applied to the read element (often, the control gate for a NAND cell) for purposes of reading that cell. "Read level offset" herein shall refer to a component of the equation that determines the read level value. Read level offsets can be summed (e.g., read level value=offset_a+offset_b+ ... ). "Read level base" herein shall refer to one of the read level offsets. Read level bases can be stored in the metadata of the memory device, for example. Each read level can correspond to one of the threshold levels described above. "Calibration" herein shall refer to altering, based on one or more measurements of a chosen data state metric (e.g., a bit error rate), a read level value (possibly by adjusting a read level offset or read level base) to better match the ideal read levels for a read or set of reads.

A write operation can store a logical value, e.g., zero or one, in a memory cell by applying a "program" voltage that corresponds to the logical value to a write gate of the cell. A read operation can be performed by applying a read voltage to a control gate of a memory cell and determining whether the read voltage is sufficient to overcome the voltage that was stored at the cell. As an example, in a single-level cell, a first voltage level (e.g., 0 volts) can correspond to a logical one, and a second voltage level (e.g., 3 volts) can correspond to a logical zero. A logical zero can be stored by applying 3 volts to the write gate and a logical one corresponds to the erased distribution, which corresponds to 0 volts in this example. To read the cell, a voltage can be applied to control gate of the cell. If the applied read voltage causes the transistor to conduct, then the voltage stored in the cell is less than the applied voltage. Thus, a voltage between the first and second voltage levels can subsequently be applied to the control gate to determine whether a logical zero or one is stored in the cell. For example, if 1.5 volts are applied to the control gate, and the cell threshold voltage is at 3 volts (logical zero), then the transistor does not conduct (because the applied 1.5 volts does not overcome the written 3 volts), and the stored value can be determined as being a logical zero. Alternatively, if the cell threshold voltage is at 0 volts (logical one), and 1.5 volts are applied to the control gate, the transistor conducts (because the applied 1.5 volts overcomes the written volts), thereby indicating a logical one.

As discussed above, n bits of information can be stored in a memory cell using multiple voltage levels. The read voltage level can be understood as corresponding to the valley between two distributions of voltages, as described below. The read voltage level can be between two threshold voltages, each of which can separate the voltage level from another voltage level. To store n bits of information, $2^n$ threshold distributions (levels) can be defined. To read $2^n$ threshold distributions, $2^n-1$ read thresholds (read values) can be established. For example, to store 2 bits of information, which can represent four different logical values, the corresponding threshold voltages can be 1 volt, 2 volts, and 3 volts. A particular logical value can be stored in the cell by applying the program voltage level that corresponds to the logical value to a write gate of the cell. Then, to read the two bits of information from the cell, three operations can be performed to identify the voltage that overcomes the voltage that was stored in the cell: apply 0.5 volts on the control gate and read (e.g., by determining whether the transistor conducts), apply 1.5 volts and read, and apply 2.5 volts and read. The results can be used to determine the values of the two logical bits. If applying 0.5 volts causes the transistor to conduct, then 0.5 volts has overcome the written voltage, so the written voltage is 0 volts (e.g., logical zero). Similarly, if applying 1.5 volts causes the transistor to conduct, then the written voltage is 1 volts (e.g., logical one), and the threshold voltage is 1.5 volts. If applying 2.5 volts causes the transistor to conduct, then the written voltage is 2 volts (e.g., logical three). Otherwise, the written voltage is 3 volts (e.g., logical two). When writing, the voltage that is placed on the write gate is inexact and, over a number of memory cells, can be represented as a distribution of voltages around each of the program voltage levels. Thus, in a cell that stores a voltage that can be interpreted as representing two bits, there are four corresponding threshold voltage distributions. Each distribution can be understood as a curve having a peak, representing a highest occurrence rate, at the corresponding program voltage level. Each voltage distribution can have rates that decrease on the left and right sides of the peak. The rates can decrease toward minimum values that approach rates of 0 at voltages (below and above the program voltage level) on the left and right sides of the peak. The voltages of the minimum rates can correspond to the threshold voltages at the boundaries between the voltage distribution and neighboring voltage distributions.

Because of the phenomenon known as slow charge loss ("SCL"), the threshold voltage of a memory cell change over time as the electric charge of the cell degrades, which is referred to as "temporal voltage shift" (since the degrading electric charge causes the voltage distributions to shift along the voltage axis towards lower voltage levels). Temporal voltage shift (TVS) herein shall refer to a change in the measured voltage of cells as a function of time. Temporal Voltage Shift can include different components such as intrinsic charge loss, system charge loss, quick charge loss, etc. Memory formed from certain NAND technologies generally exhibits more TVS than floating gate NAND. TVS is generally increased by Program Erase Cycles (PEC), higher temperatures, and higher program voltages. TVS shows significant die-to-die variation. In memory that exhibits TVS, the threshold voltage is changing rapidly at first (immediately after the memory cell was programmed), and then slows down in an approximately logarithmic linear fashion with respect to the time elapsed since the cell programming event. If not mitigated, the temporal voltage shift caused by the slow charge loss can result in the increased bit error rate in read operations.

Aspects of the present disclosure address the above and other deficiencies by providing a memory sub-system controller that determines read level values suitable for mitigation of the temporal voltage shift by measuring a voltage distribution parameter value ("parameter value") for each block or group of blocks stored in a memory device, and identifying read level values that correspond to the parameter value. The memory sub-system controller can use the read level values when reading data from the block or group of blocks to mitigate the temporal voltage shift. The parameter value can be, for example, a voltage corresponding to a particular feature of a voltage distribution of a memory cell. The particular feature can be, for example, a characteristic of the voltage distribution, such as a peak, median, mean, or mode of the voltage distribution. The parameter value changes over time, and can correspond to an amount of temporal voltage shift of the memory cell. The memory sub-system controller can use a particular parameter value to determine read levels that are suitable for an amount of temporal voltage shift that corresponds to the particular parameter value.

"Distribution voltage" herein shall refer to a distribution parameter value that is a voltage and corresponds to a particular feature of a voltage distribution of a memory cell. For example, a distribution voltage can be understood as the voltage value that corresponds to a peak of a voltage distribution. The distribution voltage can be the median, mean, mode, or other characteristic of the voltage distribution. The voltage distribution can be a particular one of the voltage distributions of a memory cell, e.g., the 7th voltage distribution (or other designated voltage distribution) of a triple-layer memory cell that can store a voltage that can represent eight values corresponding to 8 voltage distributions numbered 0 through 7. The memory sub-system controller can look up the read level values that correspond to a particular parameter value in a mapping table that maps parameter values to corresponding read level values. For example, the mapping table can be a voltage mapping table that maps distribution voltages to read levels. The voltage mapping table can be generated from empirical data using a process that identifies distribution voltages that correspond to suitable read level values (e.g., read level values that produce low error rates, high accuracy, or the like).

In some embodiments, interpolation can be used to determine the read levels for distribution voltages that are not present in the voltage mapping table. If a distribution voltage is not in the voltage mapping table, the memory sub-system controller can determine the read level values for the distribution voltage by interpolation between two chosen voltage values in the mapping table that are, respectively, greater than and less than the distribution voltage. For example, the first chosen voltage value can be the greatest voltage value in the mapping table that is less than the distribution voltage, and the second chosen voltage value can be the least voltage value in the mapping table that is greater than the distribution voltage. The read levels can be determined as an average of the first and second voltage values. For example the difference between the first voltage and the distribution voltage can be used to weight the read level values associated with the first value relative to the read level values associated with the second value in a weighted average calculation.

In some embodiments, instead of measuring the distribution voltage of a block for each memory read operation, the memory sub-system controller can measure the distribution voltage of a block less frequently, and store the distribution voltage in a block metadata table or other mapping table that associates blocks with distribution voltages. For example, the distribution voltage of a block can be measured and stored in the block metadata table each time that the time since program of the block increases by a threshold amount, e.g., 50%, from the previous time the distribution voltage of the block was measured. The memory sub-system controller can then retrieve the distribution voltage for a particular block from the block metadata table, e.g., by looking up the distribution voltage that corresponds to the block in the block metadata table for each memory read operation. The memory sub-system controller can then use the voltage mapping table to determine the read levels that correspond to the distribution voltage. Storing the distribution voltage in association with the block and accessing the stored distribution voltage in read operations in this way enables read operations to be performed quickly and efficiently, without substantial additional delay to identify the read levels based on the distribution voltage.

In some embodiments, the memory sub-system controller can store the distribution voltages in a block family metadata table that associates block families, which can represent sets of blocks, with distribution voltages. The memory sub-system controller can maintain a block metadata table that associates each set of block with a corresponding block family. A set of blocks may be, for example, a range of block identifiers or other set of blocks that are expected to have similar SCL characteristics. To determine the read levels for a block read operation, the memory sub-system controller can identify the block family that contains the block (using the block metadata table), identify the distribution voltage associated with the block family (using the block family metadata table), and identify the read levels that correspond to the distribution voltage (using a voltage mapping table). Over time, the distribution voltage associated with each block family in the block family metadata table can be updated, e.g., by sampling the distribution voltage of a block in each block family to be updated. The distribution voltage associated with a block family can be updated at periodic intervals, or after a threshold time period passes subsequent to the next write operation to a block in the block family, for example. A distribution voltage can be understood as representing a "position" of a distribution that along an axis. The position can correspond to a feature, such as a peak, of a particular voltage distribution, such as the 7th voltage distribution, of a memory cell. As time after program increases, the position of the feature of the particular distribution, which is represented by the distribution voltage, moves toward lower voltages that reflect the state of the temporal voltage shift. The memory sub-system controller can measure the distribution voltage as a value of a voltage at a particular memory cell or a group of cells of a block. The measured distribution voltage can be used to determine read level values for the memory cell and for other memory cells that are likely to have a similar amount of temporal voltage shift, such as other memory cells that store data for the same block or superblock as the measured memory cell. At a particular time after program, the memory sub-system can mitigate the temporal voltage shift effect when performing a read operation by measuring the position of a feature of the particular voltage distribution ("distribution position"), such as the voltage of the median of the distribution, at a particular memory cell or a group of cells, and mapping the measured position (e.g., distribution voltage) to read level values that have previously been determined to correspond to the distribution position. The memory sub-system can use the read level values to read data from the memory cell.

Advantages of the present disclosure include, but are not limited to, a lower number of operations performed to determine read levels than in other techniques that attempt to mitigate the effects of temporal voltage shift at a finer granularity. For example, according to the present disclosure, operations that determine read level offsets can be performed on demand, e.g., in response to requests to access particular blocks, without additional overhead or complexity of garbage-collection-related operations that can run indefinitely during system operation. Read level offsets for a block or group of blocks change in accordance with the age of the block because the distribution voltage changes to values that correspond to older blocks as a result of the temporal voltage shift effect itself. Further, entries in the block metadata table can be deleted when the block is written to. Furthermore, the operation of determining the distribution voltage may require fewer system resources and fewer reads, since reads are done at block family level as opposed to being done at block level. Thus, performing reads at the block family level can improve system performance.

Storing the distribution voltages in association with block families and accessing the stored distribution voltages in read operations using the block families of the blocks being read can substantially reduce the amount of storage space used by the metadata table, since each one association is stored in the block family metadata table per block family instead of per block. A block family can correspond to, e.g., hundreds or thousands of blocks, so the block family metadata table can be substantially smaller than a metadata table in which a separate association with a distribution voltage is stored for each block. Since block families can include blocks having similar SCL characteristics, such as ages, wear, or temperature history, using a single distribution voltage to determine read levels for each of the blocks in a block family is unlikely to cause a decrease in read accuracy or increase in read errors.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such. A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM). The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

In some implementations, memory sub-system 110 can use a striping scheme, according to which every data payload (e.g., user data) utilizes multiple dies of the memory devices 130, 140 (e.g., NAND type flash memory devices), such that the payload is distributed through a subset of dies, while the remaining one or more dies are used to store the error correction information (e.g., party bits). Accordingly, a set of blocks distributed across a set of dies of a memory device using a striping scheme is referred herein to as a "superblock."

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a read level manager component 113 that can determine suitable read levels for memory cells based on voltages associated with particular features of voltage distributions of memory cells. As described above, temporal voltage shift causes the threshold read levels of a memory cell to change over time. The read levels determined based on distribution voltages as described below can mitigate the effects of temporal voltage shift. When writing data to a memory cell, it is inexact how much voltage is placed on the written gate of the cell. Thus, for writes of specified target voltages to a number of memory cells, there is a distribution of voltages around each of the target voltages. A voltage distribution can be a distribution of threshold voltages across a plurality of memory cells programmed to particular a state associated with the voltage distribution.

The read level manager component 113 can perform a calibration scan at particular times to measure the distribution voltages associated with the particular features of the voltage distributions of one or more cells in each block (or superblock or other storage unit), and store the measured distribution voltages in a block metadata table in association with the block. A read operation, the read level manager component 113 can determine the distribution voltage that corresponds to a block by looking up the block in the block metadata table and retrieving the distribution voltage that corresponds to the block from the block metadata table. The read level manager component 113 can then determine suitable read levels for the read operation by looking up the read levels that correspond to the voltage in a voltage mapping table, and perform the read operation by reading data from the block using the read levels.

In particular embodiments, the memory sub-system controller 115 includes at least a portion of the read level manager component 113. For example, the memory sub-system controller 115 can include a processor 117 (processing device) configured to execute instructions stored in local memory 119 for performing the operations described herein. In some embodiments, the read level manager component 113 is part of the host system 110, an application, or an operating system. Further details regarding the read level manager component 113 are described below.

Figure 2:
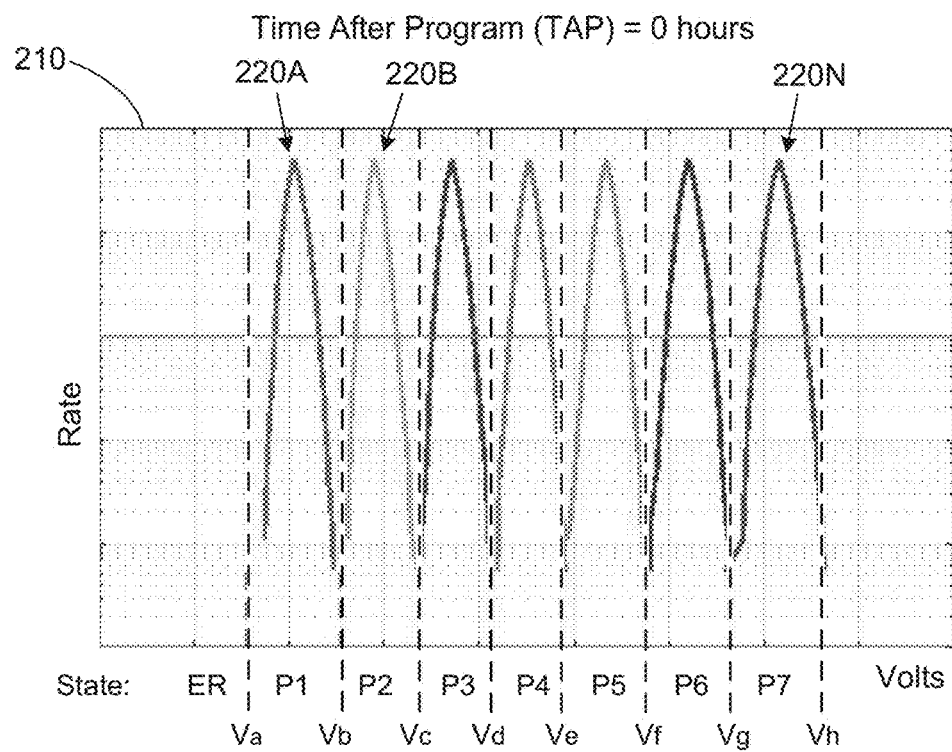
FIG. 2 schematically illustrates the temporal voltage shift caused by the slow charge loss exhibited by triple-level memory cells, in accordance with some embodiments of the present disclosure.
Figure 2:
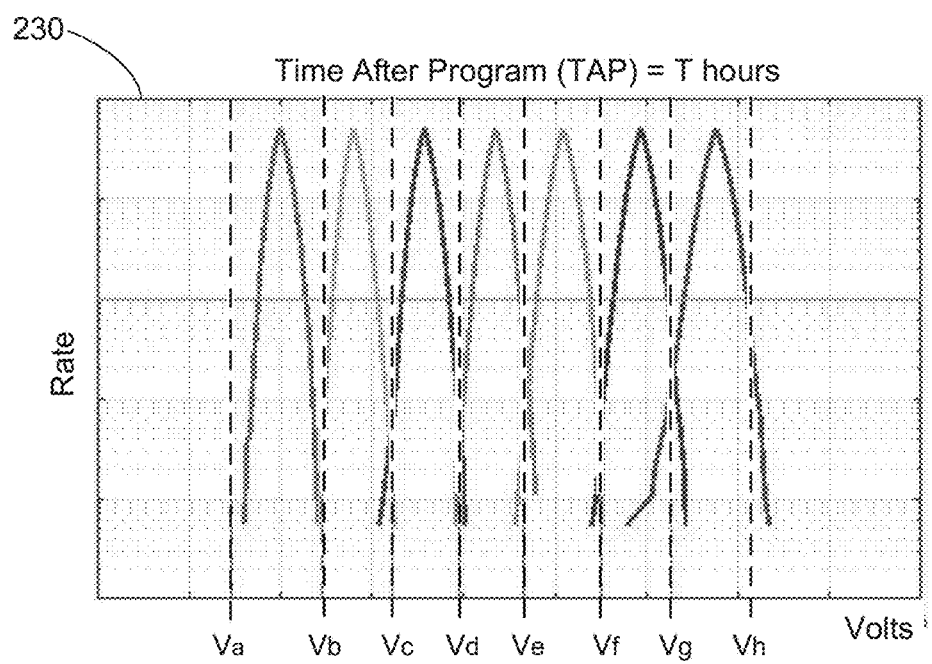

FIG. 2 illustrates the temporal voltage shift caused at least in part by the slow charge loss exhibited by triple-level memory cells, in accordance with embodiments of the disclosure. While the illustrative example of FIG. 2 utilizes triple-level cells, the same observations can be made and, accordingly, the same remedial measures are applicable to single level cells and any memory cells having multiple levels. A memory cell can be programmed (written to) by applying a certain voltage (e.g. program voltage) to the memory cell, which results in an electric charge stored by the memory cell. Precisely controlling the amount of the electric charge stored by the memory cell allows a memory cell to have multiple threshold voltage levels that correspond to different logical levels, thus effectively allowing a single memory cell to store multiple bits of information. A memory cell operated with $2^n$ different threshold voltage levels is capable of storing n bits of information.

Each of chart 210 and 230 illustrates program voltage distributions 220A-220N (also referred to as "program distributions" or "voltage distributions" or "distributions" herein) of memory cells programmed by a respective write level (which can be assumed to be at the midpoint of the program distribution) to encode a corresponding logical level. The program distributions 220A through 220N can illustrate the range of threshold voltages (e.g., normal distribution of threshold voltages) for memory cells programmed at respective write levels (e.g., program voltages). In order to distinguish between adjacent program distributions (corresponding to two different logical levels), the read threshold voltage levels (shown by dashed vertical lines) are defined, such that any measured voltage that falls below a read threshold level is associated with one program distribution of the pair of adjacent program distributions, while any measured voltage that is greater than or equal to the read threshold level is associated with another program distribution of the pair of neighboring distributions. In chart 210, eight states of the memory cell are shown below corresponding program distributions (except for the state labeled ER, which is an erased state, for which a distribution is not shown). Each state corresponds to a logical level. The threshold voltage levels are labeled Va-Vh. As shown, any measured voltage below Va is associated with the ER state. The states labeled P1, P2, P3, P4, P5, P6, and P7 correspond to distributions 22A-220N, respectively.

Time After Program (TAP) herein shall refer to the time since a cell has been written and is a primary driver of TVS (temporal voltage shift), along with temperature. TAP can be estimated (e.g., inference from a data state metric), or directly measured (e.g., from a controller clock). A cell, block, page, block family, etc. is young (or, comparatively, younger) if it has a (relatively) small TAP and is old (or, comparatively, older) if it has a (relatively) large TAP. A time slice is a duration between two TAP points during which a measurement can be made (e.g., perform reference calibration from 8 to 12 minutes after program). A time slice can be referenced by its center point (e.g., 10 minutes).

As seen from comparing example charts 210 and 230, which reflect the time after programming (TAP) of 0 (immediately after programming) and the TAP of T hours (where T is a number of hours), respectively, the program distributions change over time due primarily to slow charge loss. In order to reduce the read bit error rate, the corresponding read threshold voltages can be adjusted to compensate for the shift in program distributions, which are shown by dashed vertical lines. In various embodiments of the disclosure, the temporal voltage shift is selectively tracked for die groups based on measurements performed at one or more representative dice of the die group. Based on the measurements made on representative dice of a die group that characterize the temporal voltage shift and operational temperature of the dice of the die group, the read threshold voltage offsets used to read the memory cells for the dice of the die group are updated and are applied to the base read threshold levels to perform read operations.

Figure 3:
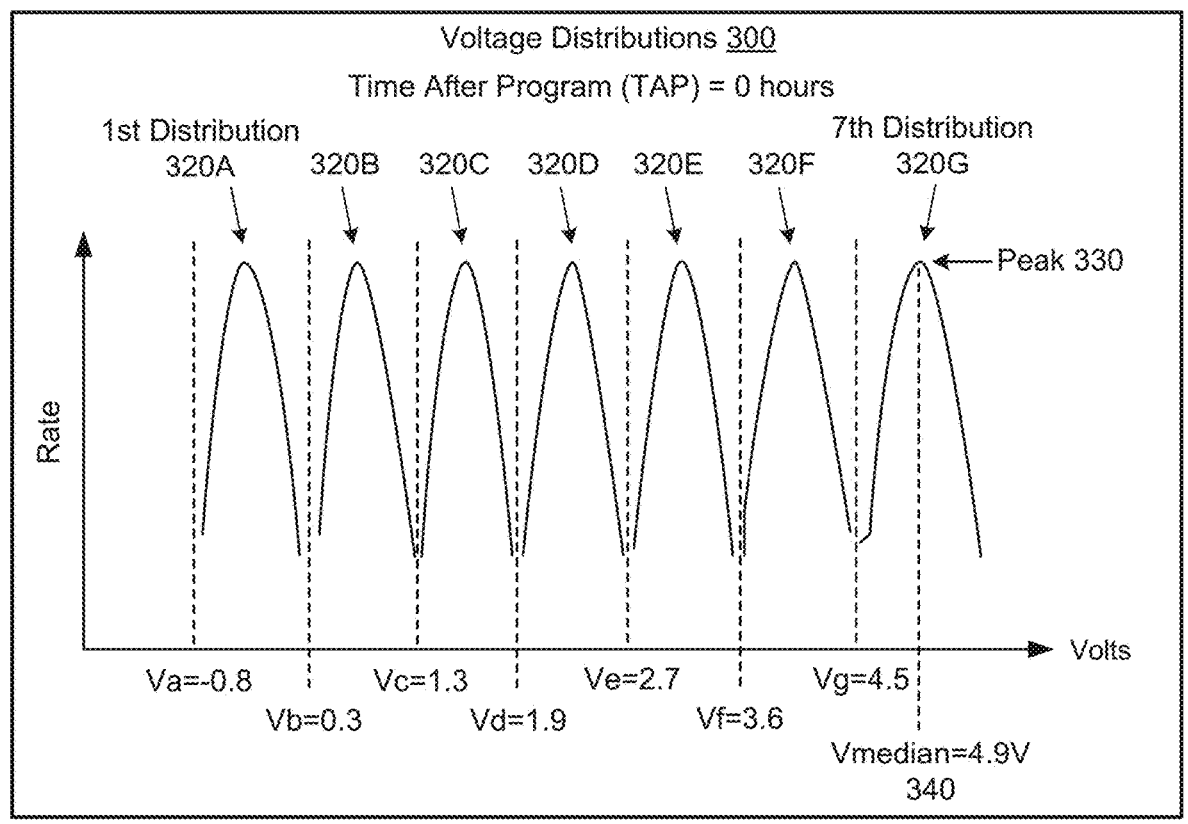
FIG. 3 schematically illustrates distribution voltages that correspond to particular features of voltage distributions and changes in the voltage distributions and distribution voltages over time, in accordance with some embodiments of the present disclosure.
Figure 3:
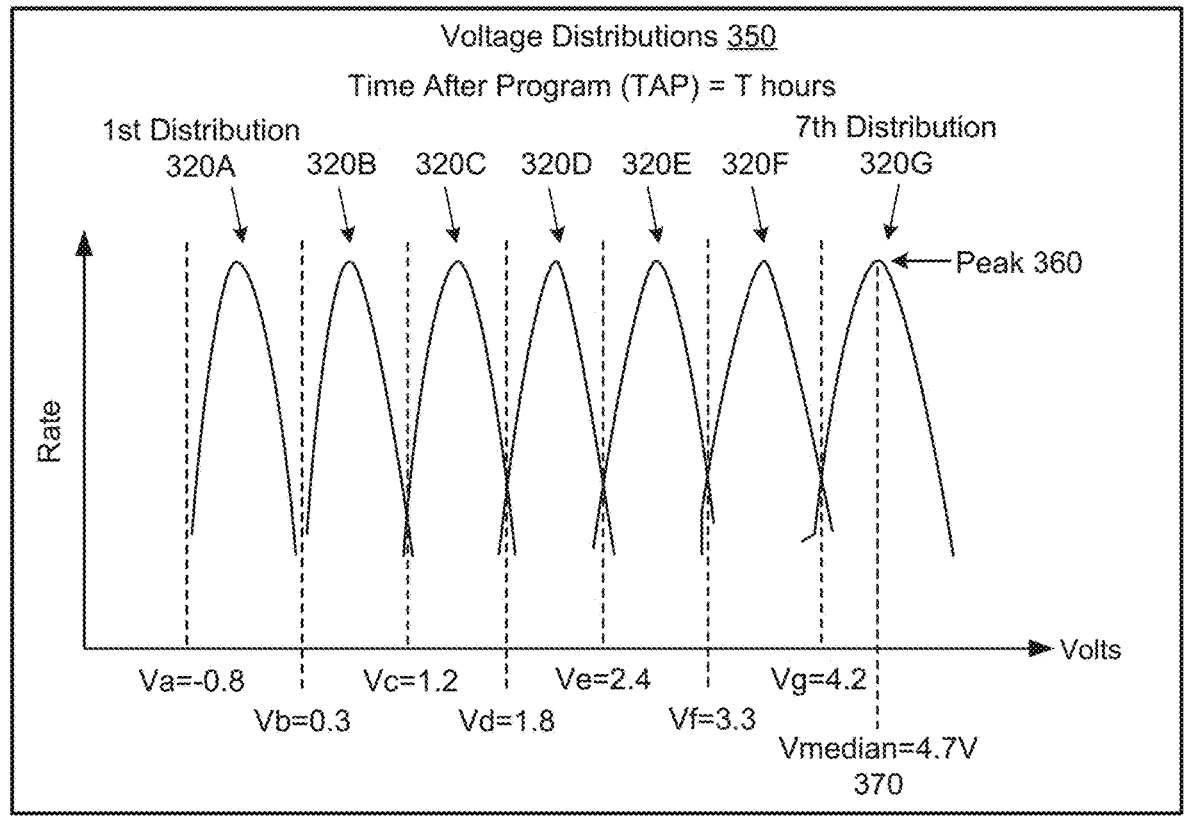

FIG. 3 schematically illustrates distribution voltages that correspond to particular features of voltage distributions and changes in the voltage distributions and distribution voltages over time, in accordance with some embodiments of the present disclosure. While the illustrative example of FIG. 3 utilizes triple-level cells, the same observations can be made and, accordingly, the same remedial measures are applicable to single level cells and any memory cells having multiple levels. FIG. 3 shows a chart 300 that illustrates voltage distributions of a memory cell at a time after program (TAP) of 0 hours, and a chart 350 that illustrates voltage distributions of the memory cell at a subsequent TAP of T hours. As described above with respect to FIG. 2, the voltage distributions 320A-G have moved after T hours, as shown in chart 350.

Each of chart 300 and 350 illustrates seven program voltage distributions 320A-320G of memory cells programmed by a respective write level (which can be assumed to be at the midpoint of the program distribution) to encode a corresponding logical level. The program distributions 320A through 320G are similar to the program distributions 220A through 220N described above with respect to FIG. 2. Each memory cell has eight states, which include an erase state corresponding to voltages below the first voltage distribution 320A, and seven logical level states corresponding to the seven voltages distributions 320A through 320G.

The voltage distributions 320A through 320G can illustrate the range of threshold voltages (e.g., normal distribution of threshold voltages) for memory cells programmed at respective write levels (e.g., program voltages). As described above with respect to FIG. 2, in order to distinguish between adjacent program distributions (corresponding to two different logical levels), the read threshold voltage levels (shown by dashed vertical lines) are defined, such that any measured voltage that falls below a read threshold level is associated with one program distribution of the pair of adjacent program distributions, while any measured voltage that is greater than or equal to the read threshold level is associated with another program distribution of the pair of neighboring distributions.

Each voltage distribution 320A-320G corresponds to a logical level. The read threshold voltage levels are labeled Va-Vh. Any measured voltage below Va is associated with the erase state. For example, a measured voltage is associated with the erase state or one of seven program states P1-P7 depending on the relation of the measured voltage to a threshold or pair of thresholds, as shown in Table 1 below.

TABLE 1

| Lower Threshold | Upper Threshold | State |
|---|---|---|
| None | Va | Erase |
| Va | Vb | P1 |
| Vb | Vc | P2 |
| Vc | Vd | P3 |
| Vd | Ve | P4 |
| Ve | Vf | P5 |
| Vf | Vg | P6 |
| Vg | None | P7 |

As shown in chart 300, at TAP=0 the threshold voltage levels have the values Va=−0.8, Vb=0.3, Vc=1.3, Vd=1.9, Ve=2.7, Vf=3.7, and Vg=4.5 volts. A distribution voltage can be calculated based on one or more of the voltage distributions 320A-320G. For example, a distribution voltage can correspond to the position on the voltage axis of a feature such as a peak 330 of the seventh distribution 320G. The distribution voltage can be calculated as a function of the seventh distribution 320G, e.g., the median, mean, mode, or other function of the distribution. In the example of chart 300, the distribution voltage is shown as Vmedian 340, which is calculated as the median of the seventh distribution 320G at TAP=0 and has the value 4.9 volts.

As shown in chart 350, at TAP=T hours, the threshold voltage levels have the values Va=−0.8, Vb=0.3, Vc=1.2, Vd=1.8, Ve=2.4, Vf=3.3, and Vg=4.2 volts. The peak of the seventh distribution 320G at TAP=T is shown as peak 360. In the example of chart 350, the distribution voltage is shown as Vmedian 370, which is calculated as the median of the seventh distribution 320G at TAP=T and has the value 4.7 volts.

Although particular features of particular voltage distributions, such as the median of the seventh voltage distribution, are described above, any suitable feature of any voltage distribution can be used to determine a distribution voltage. For example, the mean of the 6th voltage distribution 320F can be used as a distribution voltage. As another example, the distribution voltage can be calculated as the 90th percentile of the 7th voltage distribution, which corresponds to a lower right side of the distribution. In another example, the distribution voltage can be calculated as a mean (e.g., average) of the 25th and 75th percentile of the 7th voltage distribution. In yet another example, the distribution voltage can be calculated as a mean of the means of the 6th and 7th voltage distributions. In particular embodiments, higher-numbered distributions are used to calculate the distribution voltage, since higher-numbered distributions move more quickly over time than lower-numbered distributions, and hence higher-numbered distributions carry a stronger signal of TVS. In other embodiments, one or more lower-numbered distributions can be used to calculate the distribution voltage, however. For example, the distribution voltage can be calculated as a mean of the means of the 1st distribution 320A and the 7th distribution 320G.

Figure 4A:
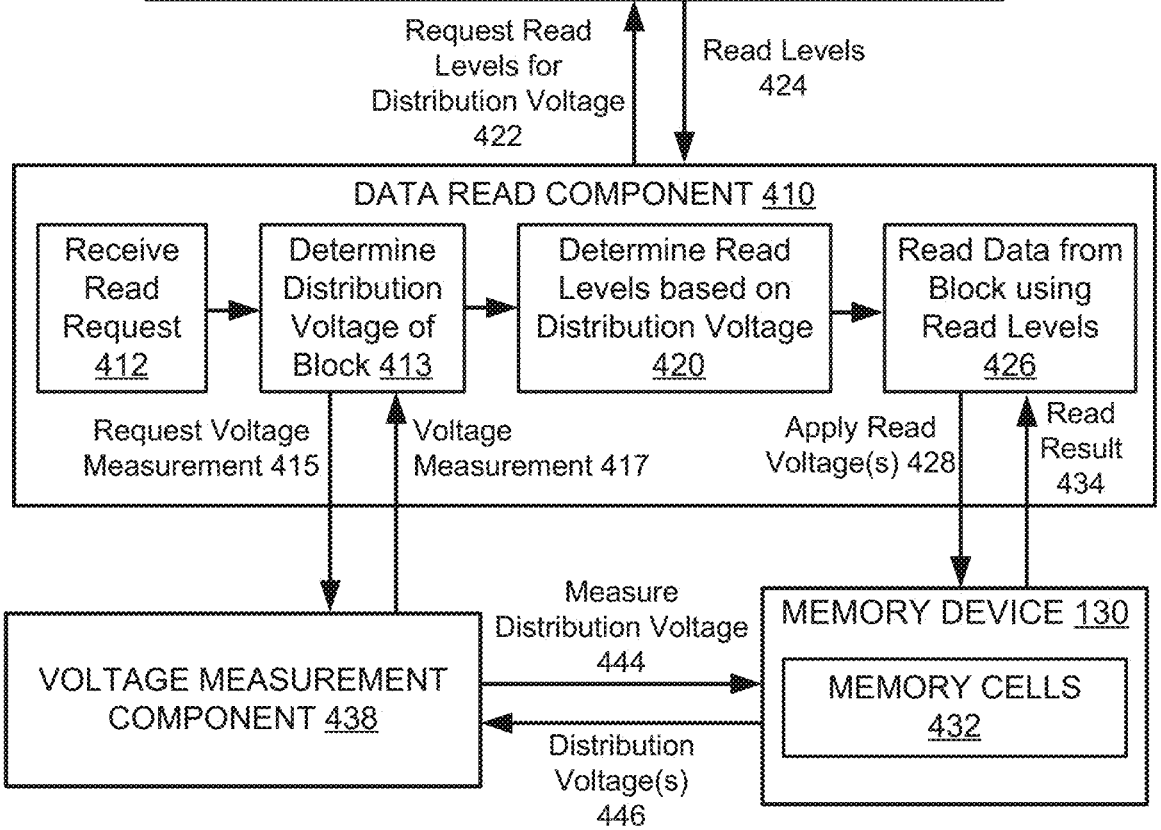
FIGS. 4A, and 4B depict example read level manager components, in accordance with some embodiments of the present disclosure.

FIG. 4A depicts an example read level manager 402, in accordance with some embodiments of the present disclosure. The read level manager 402 can correspond to the read level manager component 113 of the memory sub-system controller 115 shown in FIG. 1. The read level manager 402 can include a voltage mapping table 406, which can be stored in local memory 119 of the memory sub-system controller 115 or other suitable memory, such as a memory of the host system 120. The voltage mapping table 406 can store mappings between distribution voltages and sets of read levels. For each distribution voltage that is associated with a set of read levels, the voltage mapping table 406 can include a row containing the distribution voltage $V_M$ and the set of read levels $RL1_M$-$RLN_M$. In the example of FIG. 4A, the voltage mapping table 406 includes three entries for the distribution voltages 4.9, 4.7, and 4.3, as shown in Table 2 below.

TABLE 2

| Feature Voltage | Read Level 1 | Read Level 2 | Read Level 3 | Read Level 4 | Read Level 5 | Read Level 6 | Read Level 7 |
|---|---|---|---|---|---|---|---|
| 4.9 | −0.8 | 0.3 | 1.3 | 1.9 | 2.7 | 3.6 | 4.5 |
| 4.7 | −0.8 | 0.3 | 1.2 | 1.8 | 2.4 | 3.3 | 4.2 |
| 4.3 | −0.9 | 0.2 | 1.1 | 1.7 | 2.5 | 3.0 | 4.0 |

The example read levels in the voltage mapping table 406 for distribution voltages 4.9V and 4.7V correspond to the threshold voltages associated with Vmedian=4.9V and Vmedian=4.7V, respectively, in FIG. 3. Although the voltage mapping table 406 is described as containing read levels, which can be used in read operations, the voltage mapping table 406 can alternatively or additionally contain read level offsets, which can be added to base read levels to determine the read levels to use in read operations. The voltage mapping table 406 can be generated by a voltage mapping table generator (not shown), e.g., using an empirical process. The empirical process can, for example, perform read operations on memory cells 432 of memory device 130 using a range of distribution voltages, and analyze results received from the memory cells 432 to determine the read levels for the range of distribution voltages, as described below. In one embodiment, the empirical data can be generated during qualification testing of one or more memory devices (e.g., NAND memory devices) and appropriately averaged and reduced to represent the expected voltage mapping. In another embodiment, the empirical data can be generated during a memory device (e.g., NAND) manufacturing process to include a larger population of dies with a similar data reduction process to represent the dies in a single voltage mapping table. In yet another embodiment, the empirical data can be collected during the storage device (e.g., SSD) manufacturing process and reduced to a voltage mapping table to represent the die within a group of storage devices or within a single storage device. In yet another embodiment, the empirical data can be generated within the storage device manufacturing process for each die within a storage device, and a separate voltage mapping table can be used for each die within the storage device.

The read level manager 402 can also include a data read component 410, which can receive read requests, determine suitable read levels, and read data from one or more memory devices, such as the memory device 130, using the determined read levels. The data read component 410 can include a read request receiver 412, a distribution voltage determiner 413, a read level determiner 420, and a data reader 426. The read request receiver 412 can receive data read requests from other components of the memory sub-system controller 115 or memory sub-system 110, or from the host 120. The data read request can specify a block, e.g., as a block ID.

The distribution voltage determiner 413 can determine a distribution parameter value, such as a distribution voltage, of the block specified in the read request. For example, to determine a distribution voltage of a group of memory cells 432 specified in or associated with a read request, the distribution voltage determiner 413 can send a voltage measurement request to a voltage measurement component 438 (arrow 415). The voltage measurement request can include an identifier or address that identifies the memory cells 432 for which a voltage is to be measured. The voltage measurement component 438 can measure a distribution voltage of the memory cells 432 specified in or associated with the read request (arrow 444). The voltage measurement component 438 can measure the distribution voltage by, for example, performing read operations on a group of memory cells that includes the specified memory cells 432, as described below. The voltage measurement component 438 can receive the measured distribution voltage from the memory cells 432 (arrow 446). The voltage measurement component 438 can then send the distribution voltage(s) to the distribution voltage determiner 413 (arrow 417).

The read level determiner 420 can send a query specifying the distribution voltage to the voltage mapping table 406 (arrow 422). If the voltage mapping table 406 contains a mapping from the specified distribution voltage to corresponding read levels, the corresponding read levels can be provided to the read level determiner 420 (arrow 424).

If the voltage mapping table 406 does not contain a mapping from the specified distribution voltage to read levels, the read level determiner 420 can perform interpolation between first and second distribution voltages that are present in the voltage mapping table 406 to determine the read levels that correspond to the specified distribution voltage based on other read levels that are present in the voltage mapping table 406. The specified distribution voltage is referred to as a "target distribution voltage" in the following description. The difference between the first value and the target distribution voltage can be used to weight the read level voltages associated with the first value relative to read level values associated with the second value in a weighted average calculation. The first distribution voltage can be identified as the closest distribution voltage that is less than the target parameter value, e.g., the maximum of distribution voltages in the voltage mapping table that are less than the target distribution voltage. The second distribution voltage can be identified as the closest distribution voltage that is greater than the target distribution voltage, e.g., the minimum of distribution voltages in the voltage mapping table that are greater than the target distribution voltage. Thus, interpolation can be performed between the read level values associated with the first value and the read level values associated with the second value to determine the read level values associated with the target distribution voltage.

The difference between the target distribution voltage and the closest distribution voltages less than and greater than the target distribution voltage in the voltage mapping table can be used to interpolate each read level value for the target distribution voltage as a weighted average of the corresponding read level values of the closest distribution voltages less than and greater than the target distribution voltage. The weight of each read level value corresponding to the closest distribution voltage less than the target distribution voltage can be proportional to the difference between the closest distribution voltage less than the target distribution voltage and the target distribution voltage. Similarly, the weight of each read level value corresponding to the closest distribution voltage greater than the target distribution voltage can be proportional to the difference between the closest distribution voltage greater than the target distribution voltage and the target distribution voltage. The read level determiner 420 can determine each read level value for the target distribution voltage as the weighted average of the corresponding read level values associated with the closest distribution voltages greater than and less than the target distribution voltage.

For example, if the target distribution voltage is 4.8V, and the first and second values are 4.7V and 4.9V respectively, then the target distribution voltage of 4.8V is at half of the difference between the first and second values. Accordingly, the determined read level values can be calculated as a weighted average in which the read level values associated with the first value have a weight of 0.5 and the read level values associated with the second value also have a weight of 0.5. The distribution voltage and the associated determined read level values can be stored in the voltage mapping table, so subsequent read requests for the same target distribution voltage can retrieve the read level values without performing interpolation.

As an example, the read levels generated by interpolation for the target distribution voltage 4.8V that is not in the voltage mapping table are shown below. The target voltage of 4.8V is between a first voltage 4.7 and a second voltage 4.9, both of which are in the voltage mapping table prior to the interpolation. The result of the interpolation, which is the row for target voltage 4.8V, is shown in Table 3 below. The read level determiner 420 that performs the interpolation can store the target distribution voltage in association with the read levels generated by interpolation in the voltage mapping table 406. Since the target distribution voltage of 4.8V is half the difference between the entry above (4.9V) and the entry below (4.8V), the weights of the entry above and the entry below are both 0.5. The controller can interpolate between the entry above and the entry below by computing each read level value as the weighted average ReadLevelAbove*0.5+ReadLevelBelow*0.5. Thus, the interpolated read level values for the distribution voltage of 4.8V are −0.8, 0.3, 1.2, 1.8, 2.4, 3.3, and 4.2 volts, as shown in Table 3.

TABLE 3

| Feature Voltage | Read Level 1 | Read Level 2 | Read Level 3 | Read Level 4 | Read Level 5 | Read Level 6 | Read Level 7 |
|---|---|---|---|---|---|---|---|
| 4.9 | −0.8 | 0.3 | 1.3 | 1.9 | 2.7 | 3.6 | 4.5 |
| 4.8 | −0.8 | 0.3 | 1.25 | 1.85 | 2.55 | 3.45 | 4.35 |
| 4.7 | −0.8 | 0.3 | 1.2 | 1.8 | 2.4 | 3.3 | 4.2 |

In particular embodiments, if the read level values in the voltage mapping table 406 are read level offsets instead of read levels, then the read level determiner 420 can add the read level offsets to base read levels to determine the read levels to be used in read operations. If interpolation is performed on read level offsets, the base read levels can be associated with the same distribution as the interpolated read level values to produce total read level values. The memory system controller can then perform the read operation using the total read level values.

The data reader 426 can read data from the block using the read levels from the read level determiner 420. The data reader 426 can apply the read levels to one or more memory cells 432 of the memory device 130 (arrow 428) and read the data from the memory cell(s) 432 (arrow 434). The data reader 426 can then provide the data to other components of the memory sub-system controller 115 or the host 120.

Alternatively or additionally, the voltage measurement component 438 can measure the distribution voltage(s) by performing a sufficient number of read operations using a range of threshold voltages to measure a voltage distribution of the memory cell, and calculating the median (or other function) of the measured voltage distribution. For example, the distribution voltage can be measured at a memory cell that is identified by the voltage measurement request (arrow 415). The voltage measurement component 438 can determine the distribution voltage by, for example, identifying a feature of the distribution, such as the peak, which can be the position of the distribution having the highest rate, and determining the voltage that corresponds to the identified position of the feature. Thus, the value of the measured distribution voltage can be the voltage that corresponds to the portion of the distribution having the highest rate. The distribution voltage can be understood as representing a position of the distribution along the voltage axis.

In particular embodiments, to generate the voltage mapping table 406, a heuristic technique can be used to identify read level values that produce desirable results from the memory cell, e.g., low error rates, high accuracy, or other desirable results for each of a selected range of values of the distribution voltage. For each selected of the distribution voltage, the corresponding read level values that produce the desirable results can be stored in association with the selected distribution voltage in the voltage mapping table. As an example, read error counts or other performance criteria can be evaluated during operation or simulation of similar memory cells using one or more selected ranges of the distribution voltage. For each distribution voltage in the selected range, a desirable set of read level values corresponding to the voltage distributions of a memory cell being operated or simulated can be identified by operating or simulating the memory cell for sets of read level values over ranges of values of the read level values. The distribution voltage that corresponds to the identified set of desirable read level values can be stored in the voltage mapping table in association with the identified set of desirable read level values.

Since the voltage distributions shift toward lower voltages over time, and the measured distribution voltage-to-read-level relation can be determined, e.g., by measuring a number of memory cells, the voltage-to-read-level relation can be used to map the distribution voltage, which can be represented as a voltage, to a read level value for the particular distribution. Further, since the shift of each distribution of a multi-level cell is related, the voltage relation can be used to map the distribution voltage to a set of read level values that correspond to the voltage distributions of a multi-level memory cell, e.g., seven read level values in an eight-level architecture (in which one level corresponds to an erase state). The voltage relation can be represented as, for example, a mapping, such as the voltage mapping table 406, that maps each distribution voltage, which can be represented as a voltage, to a set of read level values. The set of read level values can include a read level value for each of the memory cell's voltage distributions. Each read level value in the set can be, e.g., a read level value that can be added to a base or a read level offset that can be added to a base read level value. Furthermore, in some implementations read levels or read level offsets on table 406 can be determined as a function of program erase cycles.

As described above, upon receiving a request to read data from a memory cell, the memory sub-system controller 115 can determine read level values for the memory cell based on a distribution voltage. The memory sub-system controller can measure the distribution voltage at the memory cell. The previously-determined distribution voltage can be a distribution voltage measured at the memory cell or at another memory cell. The memory sub-system controller can then look up read level values that are associated with the measured or previously-determined distribution voltage in the voltage mapping table 406, and use the read level values to read data from the memory cell.

The number or range of values of the distribution voltage for which entries are generated in the voltage mapping table 406 can be determined by factors such as characteristics of the memory device, including the resolution of the measurements of the distribution voltages (e.g., the distribution voltage resolution), how suitable the entries are for interpolation, the minimum and maximum values of the distribution voltages, and the amount of memory (e.g., local memory 119) or other storage space available to store the voltage mapping table 406.

In particular embodiments, the voltage mapping table 406 can include an entry for each possible value of the distribution voltage. If the number of possible values is relatively small, e.g., the resolution of the distribution voltages is sufficiently coarse, such that the memory available to store the voltage mapping table 406 is sufficient to store an entry for each possible value of the distribution voltage, then a voltage mapping table generator (not shown) can include an entry in the mapping table for each possible value of the distribution voltage. For example, if the distribution voltages are measured as voltages represented by Digital Audio Converter (DAC) units, the number of possible distribution voltages can be relatively small. If sufficient storage space is available, the voltage mapping table 406 can include an entry for each possible DAC value (e.g., for each possible DAC value, an entry mapping the DAC value to the corresponding read level values). When the memory sub-system controller 115 performs a read operation on a block, the controller 115 can use the voltage mapping table 406 to identify the read level values that correspond to the block (e.g., a block, superblock, or other unit) by measuring the distribution voltage of a group of memory cells in which the block's data is stored, and identifying the read level values associated with the distribution voltage in the voltage mapping table. Since the voltage mapping table 406 in this example includes an entry for each possible distribution voltage, and each measured value of the distribution voltage is one of the possible values, the memory sub-system controller 115 can identify an entry in the voltage mapping table 406 specifying read level values for each block hat is read.

Alternatively, the voltage mapping table generator can select a subset of the possible values of the distribution voltage and generate a voltage mapping table 406 that includes an entry for each value in the subset, and interpolation can be used to determine read levels for voltages that are not present in the mapping table, as described above.

Figure 4B:
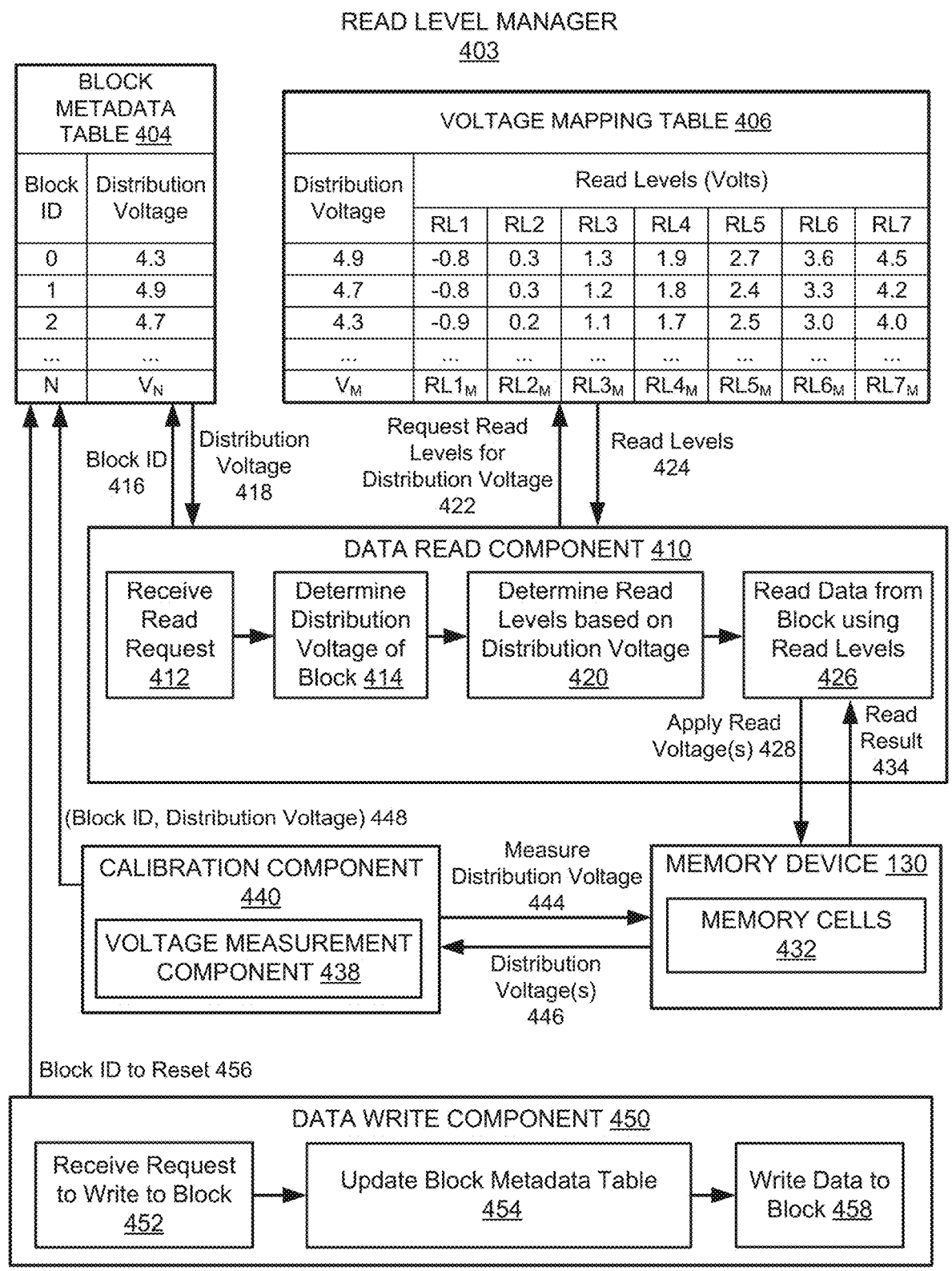

FIG. 4B depicts an example read level manager 403, in accordance with some embodiments of the present disclosure. The read level manager 403 can correspond to the read level manager component 113 of the memory sub-system controller 115 shown in FIG. 1. The read level manager 403 can include a block metadata table 404 and a voltage mapping table 406. The tables 404, 406 can be stored in local memory 119 of the memory sub-system controller 115 or other suitable memory, such as a memory of the host system 120. The block metadata table 404 can store mappings between blocks and distribution voltages. For each block that is associated with a distribution voltage, the block metadata table 404 can include a row containing a block identifier (ID) "N" of the block and the associated distribution voltage $V_N$. In the example of FIG. 4B, the block metadata table 404 includes an entry mapping block ID "0" to distribution voltage 4.3, which indicates that the distribution voltage 4.3 has been determined for block ID "0". The block metadata table 404 also includes an entry mapping block ID "1" to distribution voltage 4.9, and an entry mapping block ID "2" to distribution voltage 4.7. The block metadata table 404 can be generated by a calibration component 440 and/or a data read component 410. Entries can be removed from the block metadata table 404 by a data write component 450, as described below.

In particular embodiments, the distribution voltage and the associated determined read level values can be stored in the block metadata table 404 in association with the block so subsequent read requests for the same value of the block ID or distribution voltage can retrieve the read level values. The determined distribution voltages and read level values can be stored in the block metadata table 404 if, for example, there is sufficient memory or other storage available to store those values for each of the blocks. In another embodiment, each of the distribution voltages, and the associated read level values, can be stored in the block metadata table 404 instead of the voltage mapping table 406, in which case the voltage mapping table 406 need not be used. The voltage mapping table 406 can store mappings between distribution voltages and sets of read levels. The voltage mapping table 406 is further described above with respect to FIG. 4A.

The read level manager 403 can also include a data read component 410, a calibration component 440, and a data write component 450. As described above with respect to FIG. 4A, the data read component 410 can receive read requests, determine suitable read levels, and read data from one or more memory devices, such as memory device 130, using the determined read levels. The data read component 410 can include a read request receiver 412, a distribution voltage determiner 414, a read level determiner 420, and a data reader 426. The read request receiver 412 can receive data read requests from other components of the memory sub-system controller 115 or memory sub-system 110, or from the host 120. The data read request can specify a block, e.g., as a block ID.

The distribution voltage determiner 414 is similar to the distribution voltage determiner 413 described above with respect to FIG. 4A. The distribution voltage determiner 414 can determine a distribution parameter value, such as a distribution voltage, of the block specified in the read request. For example, the distribution voltage determiner 414 can query the block metadata table 404 for the distribution voltage having the block ID specified in the read request (arrow 416). If the block metadata table 404 contains the specified block ID, e.g., there is an entry in the metadata table 404 that maps the specified block ID to a distribution voltage, the distribution voltage determiner 414 can provide the corresponding distribution voltage to the read level determiner 420 (arrow 418), which can determine read levels as described above with respect to FIG. 4A.

If the block metadata table 404 does not contain the specified block ID, the distribution voltage determiner 414 can measure a distribution voltage for the block specified in the read request, and store the measured distribution voltage in the block metadata table 404 in association with the block ID. The distribution voltage determiner 414 can measure the distribution voltage as described below with respect to the voltage measurement component 438 of the calibration component 440.

Alternatively, if the block metadata table 404 does not contain the specified block ID, the data read component 410 can use default read levels, or pass the read request to another component of the memory sub-system controller 115, which can perform the read operation. Although the parameter value is a voltage in the examples described herein, a parameter value can be any suitable data state metric. "Data state metric" herein shall refer to a quantity that is measured or inferred from the state of data stored on a memory device. Specifically, data state metrics can reflect the state of the temporal voltage shift, the degree of read disturb, and/or other measurable functions of the data state. A data state metric can be a function (e.g., a weighted sum) of a set of component state metrics.

If the block metadata table 404 contains the specified block ID, then, as described above, the distribution voltage determiner 414 can receive the distribution voltage associated with the block ID from the block metadata table 404 (arrow 418). The read level determiner 420 can send a query specifying the distribution voltage to the voltage mapping table 406 (arrow 422). If the voltage mapping table 406 contains a mapping from the specified distribution voltage to corresponding read levels, the corresponding read levels can be provided to the read level determiner 420 (arrow 424).

If the voltage mapping table 406 does not contain a mapping from the specified target distribution voltage to read levels, the read level determiner 420 can perform interpolation, as described above with respect to FIG. 4A. The read level determiner 420 that performs the interpolation can store the target distribution voltage in the block metadata table 404 in association with the block ID of the block for which the read levels are generated. The read level determiner 420 can also store the target distribution voltage in association with the read levels generated by interpolation in the voltage mapping table 406, as described above with respect FIG. 4A.

The data reader 426 can read data from the block using the read levels from the read level determiner 420. The data reader 426 can apply the read levels to one or more memory cells 432 of the memory device 130 (arrow 428) and read the data from the memory cell(s) 432 (arrow 434). The data reader 426 can then provide the data to other components of the memory sub-system controller 115 or the host 120.

The calibration component 440 can generate or update the block metadata table 404 separately from or at different times than the read operations performed by the data read component 410. For example, the calibration component 440 can perform calibration operations that generate or update the block metadata table 404 by, for each block, measuring distribution voltages of one or more groups of memory cells 432 that store the block's data, and storing the measured distribution voltages in the block metadata table 404 in association with the corresponding block ID. In this way, the block metadata table 404 can be generated and updated without delaying read operations performed by the data read component 410. The calibration component 440 can perform the calibration operations as part of a calibration scan at periodic times, or at other times.

The memory sub-system controller 115 can periodically perform a calibration process to measure a distribution voltage for each unit of storage (e.g., block, group of blocks, or other unit of storage). The calibration process can associate each unit of storage with the distribution voltage determined for the unit of storage. The memory sub-system controller can measure the distribution voltage as part of the calibration process. For example, in the calibration process, the memory sub-system controller can measure the distribution voltage at a particular time and again at a subsequent time, e.g., at periodic intervals, or after a threshold time period passes subsequent to the next write operation associated with the memory cell. The calibration process can also delete entries from the block metadata table 404 that are no longer needed, e.g., because the blocks have been written to subsequent to the most recent update of the block metadata table entries. The calibration process can be performed as part of a calibration scan. Alternatively or additionally, the memory sub-system controller can delete or request deletion of block metadata table entries for a particular block upon the block being written to (since the write resets the temporal voltage shift) or erased (since the block is no longer in use) or otherwise becoming unused.

The calibration component 440 can include a voltage measurement component 438, which can determine the distribution voltage of each block by performing one or more measurement operation on one or more groups of memory cells 432 in which the block's data is stored (arrow 444), e.g., similarly to the voltage measurement component 438 of FIG. 4A. The measurement operation(s) that determine the block's distribution voltage can, for example, measure at least a threshold number of voltages using a range of read levels. The voltage measurement component 438 can identify a voltage that corresponds to the feature based on the measured voltages. A measured voltage of a memory cell 432 can be a digital representation of a voltage exhibited by the memory cell 432. An Analog to Digital Convertor (ADC), such as a successive approximation ADC, can be used by the voltage measurement component 438 to perform the measurement.

Alternatively or additionally, the distribution voltage can be determined by performing a sufficient number of read operations using a range of threshold voltages to measure a voltage distribution of the memory cell, and calculating the median (or other function) of the measured voltage distribution. For example, the distribution voltage can be measured at a group of memory cells 432 that stores a portion of the block's data. The memory sub-system controller can determine the distribution voltage by, for example, identifying the feature of the distribution, such as the peak, which can be the position of the distribution having the highest rate, and determining the voltage that corresponds to the identified position of the feature. Thus, the value of the measured distribution voltage can be the voltage that corresponds to the portion of the distribution having the highest rate. The distribution voltage can be understood a representing a position of the distribution along the voltage axis. The parameter value can be stored in a block metadata table 404 in association with the block, so subsequent read requests for the block can access the parameter value more efficiently (e.g., without performing the measurement operation on the memory cell). The block metadata table can be stored in a local memory 119 of the memory sub-system.

The calibration component 440 can receive the distribution voltage measured from the memory cells 432 (arrow 446) and store the measured distribution voltage in association with the block ID of the block in the block metadata table 404 (arrow 448). The calibration component 440 can perform the calibration operation repeatedly, e.g., at time intervals, so that the distribution voltages associated with the block IDs in the block metadata table are updated over time to reflect changes in the distribution voltages in accordance with temporal voltage shift.

The data write component 450 can process requests to write data to blocks. Since writing data to a block involves relocating valid block data to another block (e.g., via garbage collection or folding) and then erasing the block, writing data to the block resets the amount by which the read thresholds of the block's memory cell(s) have shifted back to 0 volts, or at least close to 0 volts. Thus, the distribution voltage stored in the block metadata table 404 can be reset accordingly, e.g., by deleting the entry for the block from the block metadata table 404, or changing the distribution voltage associated with the block in the block metadata table 404 to an initial distribution voltage that corresponds to an initial time at which little or no temporal voltage shift has occurred (e.g., TAP=0, as shown in chart 300 of FIG. 3). Accordingly, a write request receiver 452 of the data write component 450 receives each request to write data to a block, and a block metadata table updater 454 resets the entry that corresponds to the block in the block metadata table 454. For example, the metadata table updater 454 can delete the entry for the block from the metadata table 404, or change the distribution voltage associated with the block in the metadata table 404 to the initial distribution voltage described above. The metadata table updater 454 can send a delete or update operation to the block metadata table 404 (arrow 456). The delete or update operation can include the block ID of the block to be reset or deleted from the block metadata table 404. A data writer 458 can write data to the block subsequently to or concurrently with the metadata table 404 update operation. Subsequently, the calibration component 440 can update the distribution voltage associated with the block in the metadata table 404 to parameter values that change over time, thereby mitigating the effects of temporal voltage shift on read operations.

As described above, upon receiving a request to read data from a memory cell associated with a block or group of blocks, the memory sub-system controller 115 can determine read level values for the memory cell based on a distribution voltage. The memory sub-system controller can measure the distribution voltage at the memory cell or retrieve a previously-determined distribution voltage. The previously-determined distribution voltage can be a distribution voltage measured at the memory cell or at another memory cell associated with the block or group of blocks. The previously-determined distribution voltage can be retrieved from a block metadata table 404 or other data structure that associates the previously-determined data state with the block or group of blocks. The memory sub-system controller can then look up read level values that are associated with the measured or previously-determined distribution voltage in the voltage mapping table, and use the read level values to read data from the memory cell.

Figure 4C:
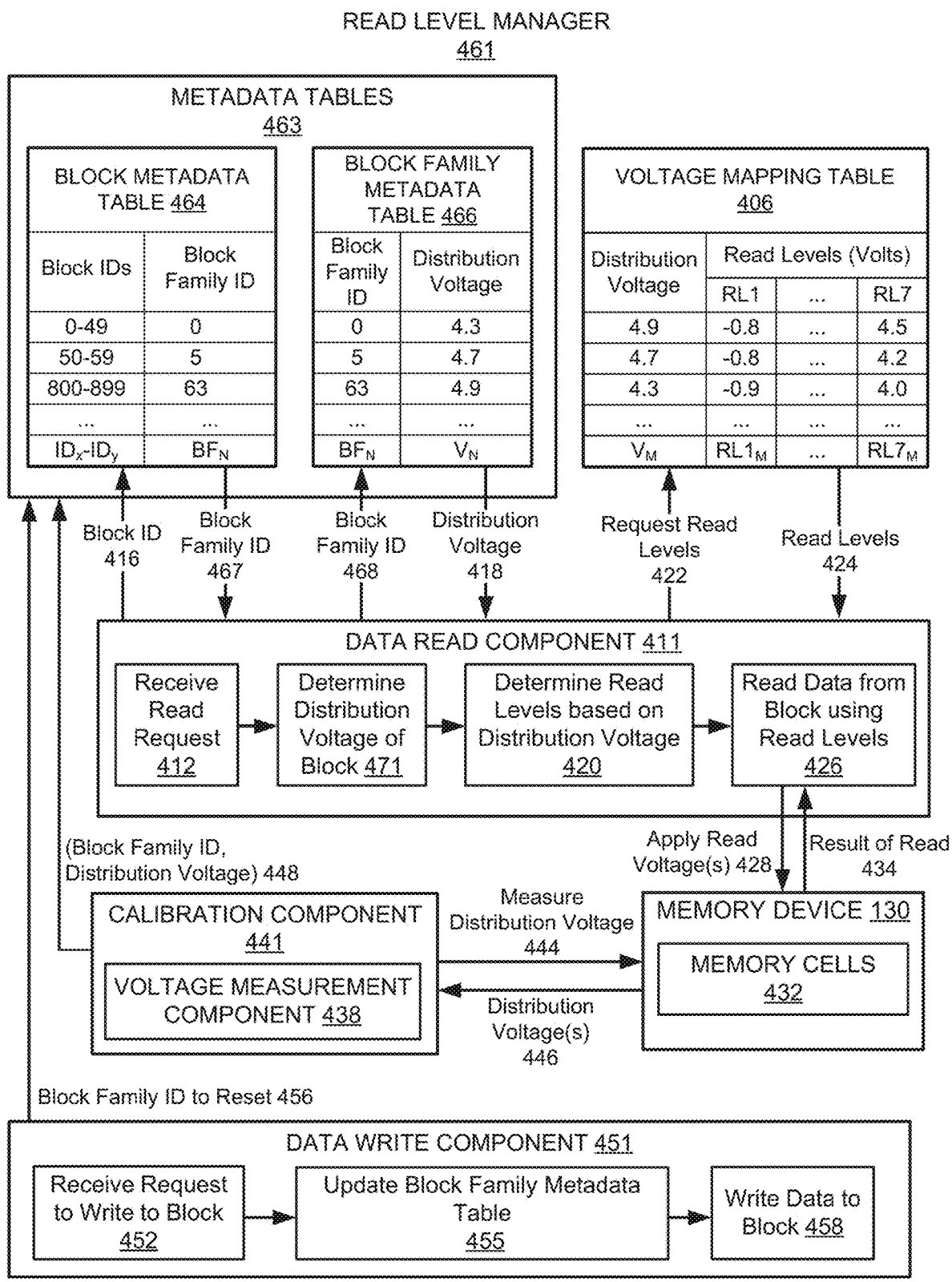
FIG. 4C depicts an example read level manager that can use block families to determine voltage distribution parameters, in accordance with some embodiments of the present disclosure.

FIG. 4C depicts an example read level manager 461 that can use block families to determine voltage distribution parameters, in accordance with some embodiments of the present disclosure. The read level manager 461 of FIG. 4C can store associations on a per-block family basis, so that an association between each block family and a corresponding distribution voltage can be stored. The corresponding distribution voltage can be used for any of the blocks in the block family. Thus, the read level manager 461 can determine the read levels for a block by determining which block family the block is in, then determining the distribution voltage associated with the block family using the stored association. The read level manager 461 can map the determined distribution voltage to read levels using the voltage mapping table 406.

A block family can represent a set of blocks that are expected to exhibit similar or correlated changes in their data state metrics over time. For example, a particular block family can represent the blocks having block IDs in the range 0-99. Thus, the distribution voltages of blocks in a particular block family are likely to be the same or similar, and a stored distribution voltage can represent the distribution voltages of the blocks in the block family. "Block family" herein shall refer to a possibly noncontiguous set of memory cells (which can reside in one or more full and/or partial blocks, the latter referred to as "partitions" herein) that have been programmed within a specified time window and a specified temperature window, and thus are expected to exhibit similar or correlated changes in their respective data state metrics. A block family can be made with any granularity, containing only whole codewords, whole pages, whole super pages, or whole superblocks, or any combination of these. Block families can be generated while data is being written based on criteria such as time and temperature. As an example, blocks written within a time window and/or temperature range can be grouped into the same block family. In some implementations, base read levels can be stored in the metadata of the memory device.

The read level manager 461 can correspond to the read level manager component 113 of the memory sub-system controller 115 shown in FIG. 1. The read level manager 461 can include metadata tables 463 that can store associations between blocks and block families, and also between block families and distribution voltages (or other voltage distribution parameters). When blocks are read, the read level manager 461 can use the metadata tables 463 to determine which block family corresponds to a particular block to be read and further determine which distribution voltage corresponds to the determined block family. The read level manager 461 can then use a voltage mapping table 406 to map the determined distribution voltage to read levels.

The metadata tables 463 can include a block metadata table 464 and a block family metadata table 466. The block metadata table 464 can store associations between blocks and block families, and the block family metadata table 466 can store associations between block families and distribution voltages (or other voltage distribution parameters). The tables 464, 466, 406 can be stored in local memory 119 of the memory sub-system controller 115 or other suitable memory, such as a memory of the host system 120.

For each set of blocks that is associated with a block family, the block metadata table 464 can include a row (also referred to herein as an "entry") that maps a set of blocks to an associated block family identifier (Block Family ID). The set of blocks can be specified as, for example, a range represented by lower and upper Block ID values, such as 0-49, which specifies 50 blocks having block IDs 0 through 49. In the example of FIG. 4C, the block metadata table 464 includes an entry mapping block IDs 0-49 to block family ID 0, which indicates that the blocks having block IDs 0 through 49 are in the block family having block family ID 0. Block metadata table 464 also includes an entry mapping block IDs 50-59 to block family ID 5, and an entry mapping block IDs 800-899 to block family ID 63. The block metadata table 464 can be generated by a calibration component 441 and/or a data read component 411, or other component that manages block families, for example. The block metadata table 464 can be updated when block families are created or deleted, e.g., by adding or removing entries that correspond to block families being created or deleted. The block metadata table 464 need not be updated when distribution voltages of block families are updated, however, since distribution voltages are not stored in the block metadata table 464.

For each block family that is associated with a distribution voltage, the block family metadata table 466 can include a row containing the block family's ID and the associated distribution voltage $V_N$. The block family metadata table 466 includes an entry mapping block family ID "0" to distribution voltage 4.3, which indicates that the distribution voltage 4.3 has been determined for block family 0 (e.g., for at least one of the blocks associated with block family 0 by the block metadata table 464). The block family metadata table 466 also includes an entry mapping block family ID "5" to distribution voltage 4.7 and an entry mapping block family ID "63" to distribution voltage 4.9. The block family metadata table 466 can be generated by the calibration component 441 and/or the data read component 411, for example. Entries can be removed from the block family metadata table 466 by the data write component 451, as described below.

In some embodiments, determined read level values can be stored in the block family metadata table 466 in association with the corresponding block family ID so subsequent read requests for the same value of the block family ID or distribution voltage can retrieve the read level values. The read level values can be stored in the block family metadata table 466 if, for example, there is sufficient memory or other storage available to store those values for each of the block families. In another embodiment, each of the distribution voltage and the associated read level values can be stored in the block family metadata table 466 instead of the voltage mapping table 406, in which case the voltage mapping table 406 need not be used. The voltage mapping table 406 can store mappings between distribution voltages and sets of read levels. The voltage mapping table 406 is further described above with respect to FIG. 4A.

The read level manager 461 can also include a data read component 411, a calibration component 441, and a data write component 451. As described above with respect to the data read component 410 of FIG. 4A, the data read component 411 can receive read requests, determine suitable read levels, and read data from one or more memory devices, such as memory device 130, using the determined read levels. The data read component 411 can include a read request receiver 412, a distribution voltage determiner 471, a read level determiner 420, and a data reader 426. The read request receiver 412 can receive data read requests from other components of the memory sub-system controller 115 or memory sub-system 110, or from the host 120. The data read request can specify a block, e.g., as a block ID.

The distribution voltage determiner 471 can determine a distribution voltage of a block specified in a read request. The distribution voltage determiner 471 is similar to the distribution voltage determiner 414 described above with respect to FIG. 4B, but uses block metadata table 464 and block family metadata table 466 to determine distribution voltages. For example, the distribution voltage determiner 471 can query the block metadata table 464 for the block family ID associated with the block ID specified in the read request (arrow 416) so that the distribution voltage determiner 471 can retrieve the block family ID from the metadata table 464 (arrow 467). The distribution voltage determiner 471 can then query the block family metadata table 466 for a distribution voltage associated with the block family ID retrieved from the metadata table 464 (arrow 468). If the block family metadata table 466 contains the specified block family ID, e.g., there is an entry in the block family metadata table 466 that maps the specified block family ID to a distribution voltage, the distribution voltage determiner 471 can retrieve the distribution voltage from the block family metadata table 466 (arrow 418). If the distribution voltage determiner 471 successfully retrieves the distribution voltage from the block family metadata table 466, then the distribution voltage determiner 471 can provide the retrieved distribution voltage to the read level determiner 420, which can determine read levels as described with respect to FIG. 4A.

If the block family metadata table 466 does not contain an entry that maps the specified block family ID to a distribution voltage, then the distribution voltage determiner 471 can measure a distribution voltage for the block specified in the read request, and store the measured distribution voltage in the block family metadata table 466 in association with the block family ID associated with the block by the block metadata table 464. The distribution voltage determiner 471 can measure the distribution voltage as described below with respect to the voltage measurement component 438 of the calibration component 440.

Alternatively, if the block family metadata table 466 does not contain an entry that maps the specified block family ID to a distribution voltage, the data read component 411 can use default read levels, or pass the read request to another component of the memory sub-system controller 115, which can perform the read operation. Although the parameter value is a voltage in the examples described herein, a parameter value can be any suitable data state metric. "Data state metric" herein shall refer to a quantity that is measured or inferred from the state of data stored on a memory device. Specifically, data state metrics can reflect the state of the temporal voltage shift, the degree of read disturb, and/or other measurable functions of the data state. A data state metric can be a function (e.g., a weighted sum) of a set of component state metrics.

If the block family metadata table 466 contains an entry that maps the specified block family ID to a distribution voltage, then, as described above, the distribution voltage determiner 471 can receive the distribution voltage associated with the block family ID from the block family metadata table 466 (arrow 418). The read level determiner 420 can send a query specifying the distribution voltage to the voltage mapping table 406 (arrow 422). If the voltage mapping table 406 contains a mapping from the specified distribution voltage to corresponding read levels, the corresponding read levels can be provided to the read level determiner 420 (arrow 424).

If the voltage mapping table 406 does not contain a mapping from the specified target distribution voltage to read levels, the read level determiner 420 can perform interpolation, as described above with respect to FIG. 4A. The read level determiner 420 that performs the interpolation can store the target distribution voltage in the block metadata table 404 in association with the block ID of the block for which the read levels are generated. The read level determiner 420 can also store the target distribution voltage in association with the read levels generated by interpolation in the voltage mapping table 406, as described above with respect FIG. 4A.

The data reader 426 can read data from the block using the read levels from the read level determiner 420. The data reader 426 can apply the read levels to one or more memory cells 432 of the memory device 130 (arrow 428) and read the data from the memory cell(s) 432 (arrow 434). The data reader 426 can then provide the data to other components of the memory sub-system controller 115 or the host 120.

The calibration component 441 can generate or update the block metadata tables 463 separately from or at different times than the read operations performed by the data read component 411. For example, the calibration component 441 can perform calibration operations that generate or update the distribution voltage of a particular block family in the block family metadata table 466 by, for one or more blocks in the particular block family, measuring distribution voltages of one or more groups of memory cells 432 that store data of the one or more blocks in the particular block family, determining a distribution voltage for the particular block family based on the measured distribution voltages, and storing the determined distribution voltage in the block family metadata table 466 in association with the block family ID that corresponds to the particular block family.

The calibration process can associate each block family with the distribution voltage determined for the block family by storing an entry representing the association in the block family metadata table 466. The memory sub-system controller 115 can measure the distribution voltage as part of the calibration process. For example, in the calibration process, the memory sub-system controller 115 can measure the distribution voltage at a particular time and again at a subsequent time, e.g., at periodic intervals, or after a threshold time period passes subsequent to the next write operation associated with the memory cell. The calibration process can also delete entries from the block family metadata table 466 that are no longer needed, e.g., because each of the blocks in a block family have been written to subsequent to the most recent update of the block family metadata table entries. The calibration process can be performed as part of a calibration scan.

The calibration component 441 can perform the calibration process as part of a calibration scan at periodic times, or at other times. The calibration component 441 can include a voltage measurement component 438, which can determine the distribution voltage of each block as described above with respect to the voltage measurement component 438 of FIG. 4B. For each block to be measured, the calibration component 441 can receive the distribution voltage measured from the memory cells 432 (arrow 446).

The calibration component 441 can determine the distribution voltage for the particular block family by computing an average of the distribution voltages of the groups of memory cells 432 for each block of the particular block family, for example. The number of blocks for which the calibration component 441 measures distribution voltages can be, for example, at least a threshold number or percentage of the total number of blocks in the block family, e.g., 25 block or 50% of the blocks in a block family having 50 blocks. In this way, the block family metadata table 466 can be generated and updated without delaying read operations performed by the data read component 411.

The calibration component 441 can store the determined distribution voltage in association with the block family ID of the particular block family in the block family metadata table 466 (arrow 448). The calibration component 411 can determine a distribution voltage of each block family, e.g., of each block family having an entry in the block metadata table 464. For example, the calibration component 441 can determine a distribution voltage for a different block family in each calibration scan, or determine the distribution voltages for a particular subset of the block families in each calibration scan. Alternatively or additionally, the distribution voltage for a particular block can be determined by performing a sufficient number of read operations using a range of threshold voltages to measure a voltage distribution of a group of memory cells, and calculating the median (or other function) of the measured voltage distribution, as described above with respect to FIG. 4B.

The calibration component 441 can perform the calibration operation repeatedly, e.g., at time intervals, so that the distribution voltages associated with the block family IDs in the block family metadata table are updated over time to reflect changes in the distribution voltages in accordance with temporal voltage shift. The time intervals can be determined in accordance with the log-linear nature of temporal voltage shift, e.g., more frequent calibrations by the calibration component 441 for higher distribution voltage values (e.g., higher values may have less TVS), and less frequent calibrations by the calibration component 441 for lower distribution voltage values.

The data write component 451 can process requests to write data to blocks. A write request receiver 452 of the data write component 451 can receive each request to write data to a block. Since writing data to a block involves relocating valid block data to another block (e.g., via garbage collection or folding) and then erasing the block, writing data to the block can reset the amount of shift of the read thresholds of the block's memory cell(s) back to 0 volts, or at least close to 0 volts. Thus, the distribution voltage stored in the block family metadata table 466 can be reset in response to writing data to blocks in the block family. For example, if data is written to each block in a block family, or to a threshold number of blocks in the block family, then the block family's entry in the block family metadata table 466 can be reset. A block family metadata table updater 455 of the data write component 451 can reset the block family's entry by deleting the entry from the block family metadata table 466 or, alternatively, by setting the entry's distribution value to an initial voltage that corresponds to an initial time at which little or no temporal voltage shift has occurred (e.g., TAP=0, as shown in chart 300 of FIG. 3).

To delete the entry for the block family from the block family metadata table 466, the block family metadata table updater 455 can send a delete operation to the block family metadata table 466 specifying the entry to be deleted (e.g., specifying the entry's block family ID, distribution voltage, or both) (arrow 456). Alternatively, to set the entry's distribution value to an initial voltage, the block family metadata table updater 455 can send an update operation to the block family metadata table 466 specifying the entry to be updated (e.g., specifying the entry's block family ID) and the updated value of the distribution voltage to be stored in the entry (arrow 456). The delete or update operation can be sent if, for example, there are no existing blocks in the block family for which temporal voltage shift has occurred (e.g., because the age of each block in the block family is less than a threshold value). Subsequent to (or concurrently with) the block family metadata table updater 455's delete or update operation, a data writer 458 can write data to the block as specified by the request to write data received by the write request receiver 452. Thus, the distribution voltages in the block family metadata table 466 can change over time. As described above, the changed distribution voltages can be determined over time by, e.g., sampling the distribution voltage(s) of one or more blocks in a block family at time intervals to determine updated distribution voltages, thereby mitigating the effects of temporal voltage shift on read operations.

As described above, upon receiving a request to read data from a memory cell associated with a block or group of blocks, the memory sub-system controller 115 can determine read level values for the memory cell based on a distribution voltage. The memory sub-system controller 115 can measure the distribution voltage at the memory cell or retrieve a previously-determined distribution voltage. The previously-determined distribution voltage can be a distribution voltage previously measured at the memory cell(s) or at other memory cells associated with the block or block family. The previously-determined distribution voltage can be retrieved from a block family metadata table 466 or other data structure that associates the previously-determined data state with the block's block family. The memory sub-system controller can then look up read level values that are associated with the measured or previously-determined distribution voltage in the voltage mapping table 406, and use the read level values to read data from the memory cell.

Figure 4D:
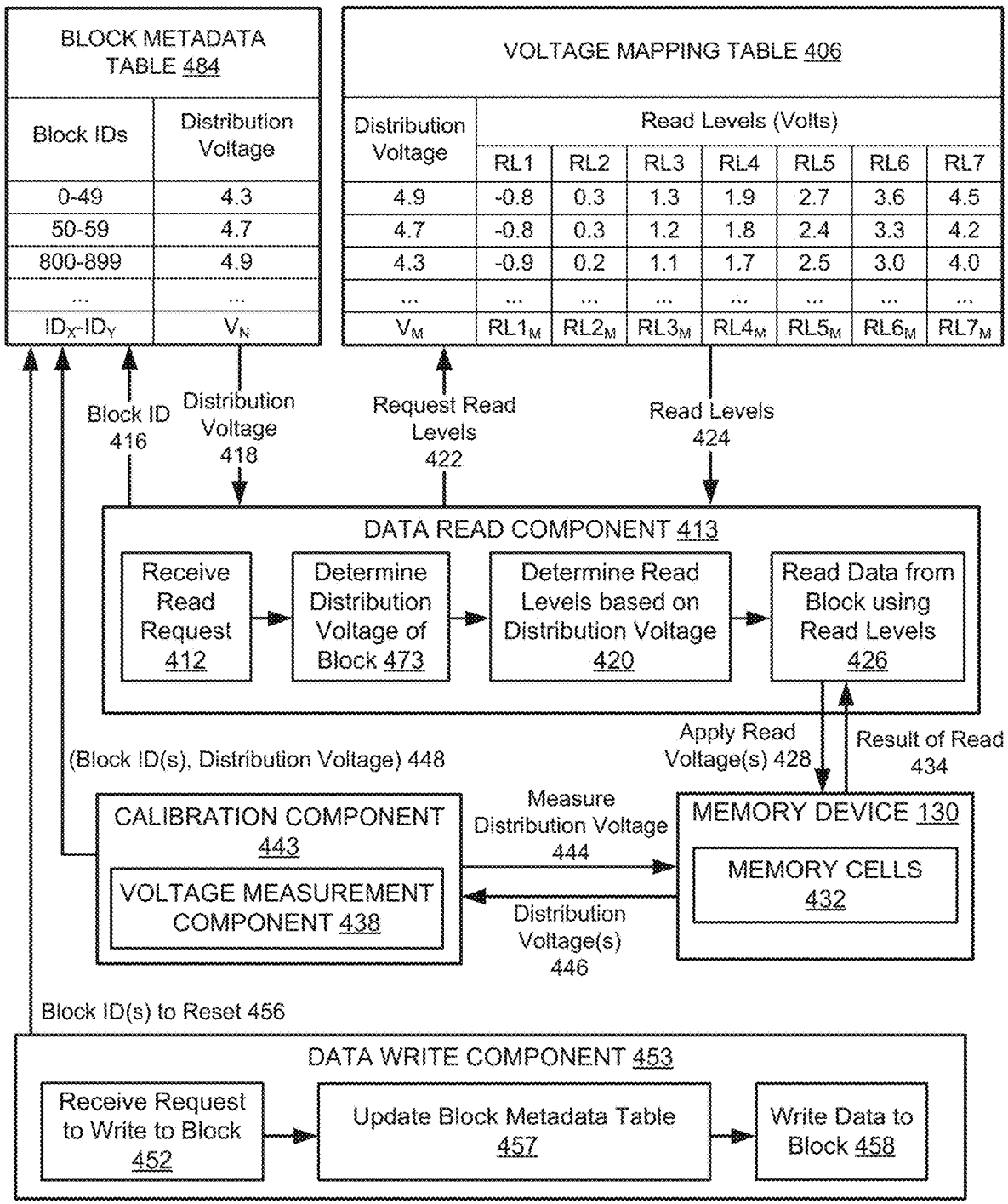
FIG. 4D depicts an example read level manager that can use sets of block identifiers to determine voltage distribution parameters, in accordance with some embodiments of the present disclosure.

FIG. 4D depicts an example read level manager 481 that can use sets of block identifiers to determine voltage distribution parameters, in accordance with some embodiments of the present disclosure. The read level manager 481 can generate and use mappings between sets of block identifiers and corresponding distribution voltages. The mappings can be stored in a block metadata table 484. Each mapping, referred to herein as an "entry," maps a set of block identifiers, e.g., identifiers in the range 0-49, to a corresponding distribution voltage, e.g., 4.3 volts ("V").

To determine the read levels for a particular block, the read level manager 481 can search the block metadata table 484 for an entry having a range that includes the block identifier of the particular block. If the block metadata table 484 contains an entry having a set that includes the block identifier of the particular block, then the read level manager 481 can determine the read levels for the particular block by searching the voltage mapping table 406 for the distribution voltage specified by the entry. A set of block identifiers can represent a set of blocks that are expected to exhibit similar or correlated changes in their data state metrics over time. For example, the range 0-99 can represent 100 blocks having block IDs from 0 to 99. A set can be specified as one or more possibly noncontiguous ranges of block identifiers. For example, identifiers 0-99 and 100-199 can be included in a set of block identifiers. The blocks in a set may have been programmed within a specified time window and/or a specified temperature window, and thus are expected to exhibit similar or correlated changes in their respective data state metrics.

The read level manager 481 can correspond to the read level manager component 113 of the memory sub-system controller 115 shown in FIG. 1. When blocks are read, the read level manager 481 can use the block metadata table 484 to identify a block ID range that corresponds to a particular block to be read. The read level manager 481 can then use the distribution voltage that corresponds to the identified block ID range to identify a set of read levels, e.g., by using a voltage mapping table 406 to map the identified distribution voltage to the set of read levels. The tables 484, 406 can be stored in local memory 119 of the memory sub-system controller 115 or other suitable memory, such as a memory of the host system 120.

For each set of block identifiers that is associated with a distribution voltage, the block metadata table 484 can include a row identifying the set of block identifiers (e.g., as one or more ranges $ID_X$-$ID_Y$) and the associated distribution voltage $V_N$. In the example of FIG. 4D, the block metadata table 464 includes an entry mapping block IDs 0-49 to distribution voltage 4.3V, which indicates that the blocks having block IDs 0 through 49 are associated with the distribution voltage 4.3V. The block metadata table 464 also includes an entry mapping block IDs 50-59 to 4.7V, and an entry mapping block IDs 800-899 to 4.9V. The block metadata table 464 can be generated by a calibration component 440 and/or a data read component 413, or other component that manages block families, for example. The block metadata table 464 can be updated when distribution voltages are determined, e.g., by updating the distribution voltage associated with a set of block identifiers in response to determining an updated value of the distribution voltage, as can be done by the calibration component 443.

In some embodiments, determined read level values can be stored in the block metadata table 484 in association with the corresponding distribution voltage entries so subsequent read requests for the same value of the block family ID or distribution voltage can retrieve the read level values. The read level values can be stored in the block metadata table 484 if, for example, there is sufficient memory or other storage available to store those values for each of the sets of blocks in the table 484. In another embodiment, each of the distribution voltage, and the associated read level values, can be stored in the block metadata table 484 instead of the voltage mapping table 406, in which case the voltage mapping table 406 need not be used. The voltage mapping table 406 can store mappings between distribution voltages and sets of read levels. The voltage mapping table 406 is further described above with respect to FIG. 4A.

The read level manager 481 can also include a data read component 413, a calibration component 443, and a data write component 453. As described above with respect to the data read component 410 of FIG. 4A, the data read component 413 can receive read requests, determine suitable read levels, and read data from one or more memory devices, such as memory device 130, using the determined read levels. The data read component 413 can include a read request receiver 412, a distribution voltage determiner 473, a read level determiner 420, and a data reader 426. The read request receiver 412 can receive data read requests from other components of the memory sub-system controller 115 or memory sub-system 110, or from the host 120. The data read request can specify a block, e.g., as a block ID.

The distribution voltage determiner 473 can determine a distribution voltage of a block specified in a read request. The distribution voltage determiner 473 is similar to the distribution voltage determiner 414 described above with respect to FIG. 4B, but uses block metadata table 484 to determine distribution voltages of blocks. For example, the distribution voltage determiner 473 can query the block metadata table 484 for the block ID specified in the read request (arrow 416). If the block metadata table 484 contains a set of block IDs that includes the specified block ID, e.g., there is an entry in the block metadata table 484 that maps the specified block ID to a corresponding distribution voltage, the distribution voltage determiner 473 can retrieve the corresponding distribution voltage from the block metadata table 464 (arrow 418). If the distribution voltage determiner 473 successfully retrieves the distribution voltage from the block metadata table 484, then the distribution voltage determiner 473 can provide the retrieved distribution voltage to the read level determiner 420, which can determine read levels as described with respect to FIG. 4A.

If the block metadata table 484 does not contain an entry that maps the specified block ID to a distribution voltage, then the distribution voltage determiner 473 can measure a distribution voltage for the block ID specified in the read request, and store the measured distribution voltage in the block metadata table 484 in association with a set of blocks that includes the specified block ID. If no set of blocks that includes the specified block ID is present in the block metadata table 484, then the distribution voltage determiner 473 can create a set of blocks that includes the block identifier (or update an existing set of blocks to include the block identifier) and store the set of blocks in the block metadata table 484 in association with the distribution voltage. The distribution voltage determiner 473 can measure the distribution voltage as described below with respect to the voltage measurement component 438 of the calibration component 443.

Alternatively, if the block metadata table 484 does not contain an entry that maps the specified block family ID to a distribution voltage, the data read component 413 can use default read levels, or pass the read request to another component of the memory sub-system controller 115, which can perform the read operation. Although the parameter value associated with the set of block identifiers in the block metadata table 484 is a voltage in the examples described herein, a parameter value can be any suitable data state metric.

If the block metadata table 484 contains an entry that maps the specified block family ID to a distribution voltage, then, as described above, the distribution voltage determiner 473 can receive the distribution voltage associated with the block family ID from the block family metadata table 484 (arrow 418). The read level determiner 420 can send a query specifying the distribution voltage to the voltage mapping table 406 (arrow 422). If the voltage mapping table 406 contains a mapping from the specified distribution voltage to corresponding read levels, the corresponding read levels can be provided to the read level determiner 420 (arrow 424).

If the voltage mapping table 406 does not contain a mapping from the specified target distribution voltage to read levels, the read level determiner 420 can perform interpolation, as described above with respect to FIG. 4A. The read level determiner 420 that performs the interpolation can store the target distribution voltage in the block metadata table 404 in association with the block ID of the block for which the read levels are generated. The read level determiner 420 can also store the target distribution voltage in association with the read levels generated by interpolation in the voltage mapping table 406, as described above with respect FIG. 4A.

The data reader 426 can read data from the block using the read levels from the read level determiner 420. The data reader 426 can apply the read levels to one or more memory cells 432 of the memory device 130 (arrow 428) and read the data from the memory cell(s) 432 (arrow 434). The data reader 426 can then provide the data to other components of the memory sub-system controller 115 or the host 120.

The calibration component 443 can generate or update the block metadata table 484 separately from or at different times than the read operations performed by the data read component 413. For example, the calibration component 443 can perform calibration operations that generate or update the distribution voltage of a particular set of blocks (e.g., block IDs 0-49) in the block metadata table 484 by, for one or more blocks in the particular set of blocks, measuring distribution voltages of one or more groups of memory cells 432 that store data of the one or more blocks, determining a distribution voltage for the particular set of blocks based on the measured distribution voltages, and storing the determined distribution voltage in the block metadata table 484 in association with the set of block identifiers that corresponds to the particular set of blocks.

The calibration component 443 can perform the calibration operations as part of a calibration scan at periodic times, or at other times. The calibration component 443 can include a voltage measurement component 438, which can determine the distribution voltage of each block as described above with respect to the voltage measurement component 438 of FIG. 4B. For each block to be measured, the calibration component 440 can receive the distribution voltage measured from the memory cells 432 (arrow 446).

The calibration component 443 can determine the distribution voltage for the particular set of blocks by computing an average of the distribution voltages of the groups of memory cells 432 for each block of the set of blocks, for example. The number of blocks for which the calibration component 443 measures distribution voltages can be, for example, at least a threshold number or percentage of the total number of blocks in the set of blocks, e.g., 25 block or 50% of the blocks in a set having 50 blocks. In this way, the sub-block metadata table 484 can be generated and updated without delaying read operations performed by the data read component 413.

The calibration component 443 can store the determined distribution voltage in association with the set of block IDs that includes the block in the block metadata table 484 (arrow 448). The calibration component 443 can determine a distribution voltage of each set of blocks, e.g., of each set of blocks having an entry in the block metadata table 484. For example, the calibration component 443 can determine a distribution voltage for a different set of blocks in each calibration scan, or determine the distribution voltages for particular sets of blocks in each calibration scan. Alternatively or additionally, the distribution voltage for a particular block can be determined by performing a sufficient number of read operations using a range of threshold voltages to measure a voltage distribution of the memory cell, and calculating the median (or other function) of the measured voltage distribution, as described above with respect to FIG. 4B.

The calibration component 443 can perform the calibration operation repeatedly, e.g., at time intervals, so that the distribution voltages associated with the sets of blocks in the block metadata table 484 are updated over time to reflect changes in the distribution voltages in accordance with temporal voltage shift.

The data write component 453 can process requests to write data to blocks. Since writing data to a block involves relocating valid block data to another block (e.g., via garbage collection or folding) and then erasing the block, writing data to the block resets the amount by which the read thresholds of the block's memory cell(s) have shifted back to 0 volts, or at least close to 0 volts. Thus, the distribution voltage stored in the block metadata table 484 can be reset in response to writing data to blocks in the set of blocks. For example, if data is written to each block in a set of blocks, or to a threshold number of blocks in the set of blocks, then the set's entry in the block metadata table 484 can be reset. A block metadata table updater 457 of the data write component 453 can reset the set's entry by deleting the entry from the block metadata table 484 or, alternatively, by setting the entry's distribution value to an initial voltage that corresponds to an initial time at which little or no temporal voltage shift has occurred (e.g., TAP=0, as shown in chart 300 of FIG. 3).

To delete the entry for the set of blocks from the block metadata table 484, the block family metadata table updater 457 can send a delete operation to the block metadata table 484 specifying the entry to be deleted (e.g., specifying the entry's range of blocks, distribution voltage, or both) (arrow 456). Alternatively, to set the entry's distribution value to an initial voltage, the block metadata table updater 457 can send an update operation to the block metadata table 484 specifying the entry to be updated (e.g., specifying the entry's rage of blocks) and the updated value of the distribution voltage to be stored in the entry (arrow 456). The delete or update operation can be sent for a set of blocks if, for example, there are no existing blocks in the set of blocks for which temporal voltage shift has occurred (e.g., because the age of each block in the set is less than a threshold value). Subsequent to (or concurrently with) the block metadata table updater 4575's delete or update operation, a data writer 458 can write data to the block as specified by the request to write data received by the write request receiver 452. Thus, the distribution voltages in the block metadata table 484 can change over time. As described above, the changed distribution voltages can be determined over time by, e.g., sampling the distribution voltage of one or more blocks in a set at time intervals to determine updated distribution voltages, thereby mitigating the effects of temporal voltage shift on read operations.

Figure 5A:
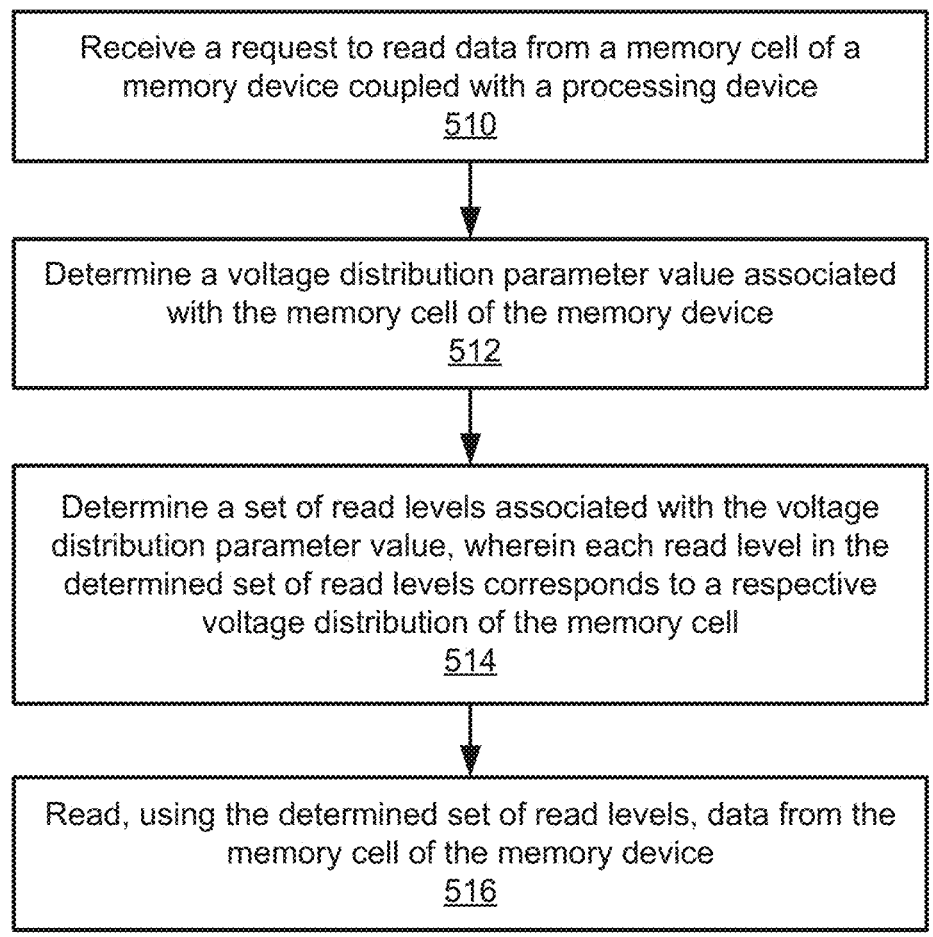
FIG. 5A is a flow diagram of an example method to determine read levels based on a distribution voltage of a memory cell and read data using the determined read levels, in accordance with aspects of the present disclosure.

FIG. 5A is a flow diagram of an example method 500 to determine read levels based on a distribution voltage of a memory cell and read data using the determined read levels, in accordance with aspects of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the read level manager component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing device can receive a request to read data from a memory cell of a memory device coupled with a processing device. At operation 512, the processing device can determine a voltage distribution parameter value associated with the memory cell of the memory device. At operation 514, the processing device can determine a set of read levels associated with the voltage distribution parameter value, wherein each read level in the determined set of read levels corresponds to a respective voltage distribution of the memory cell. At operation 516, the processing device can read, using the determined set of read levels, data from the memory cell of the memory device.

Figure 5B:
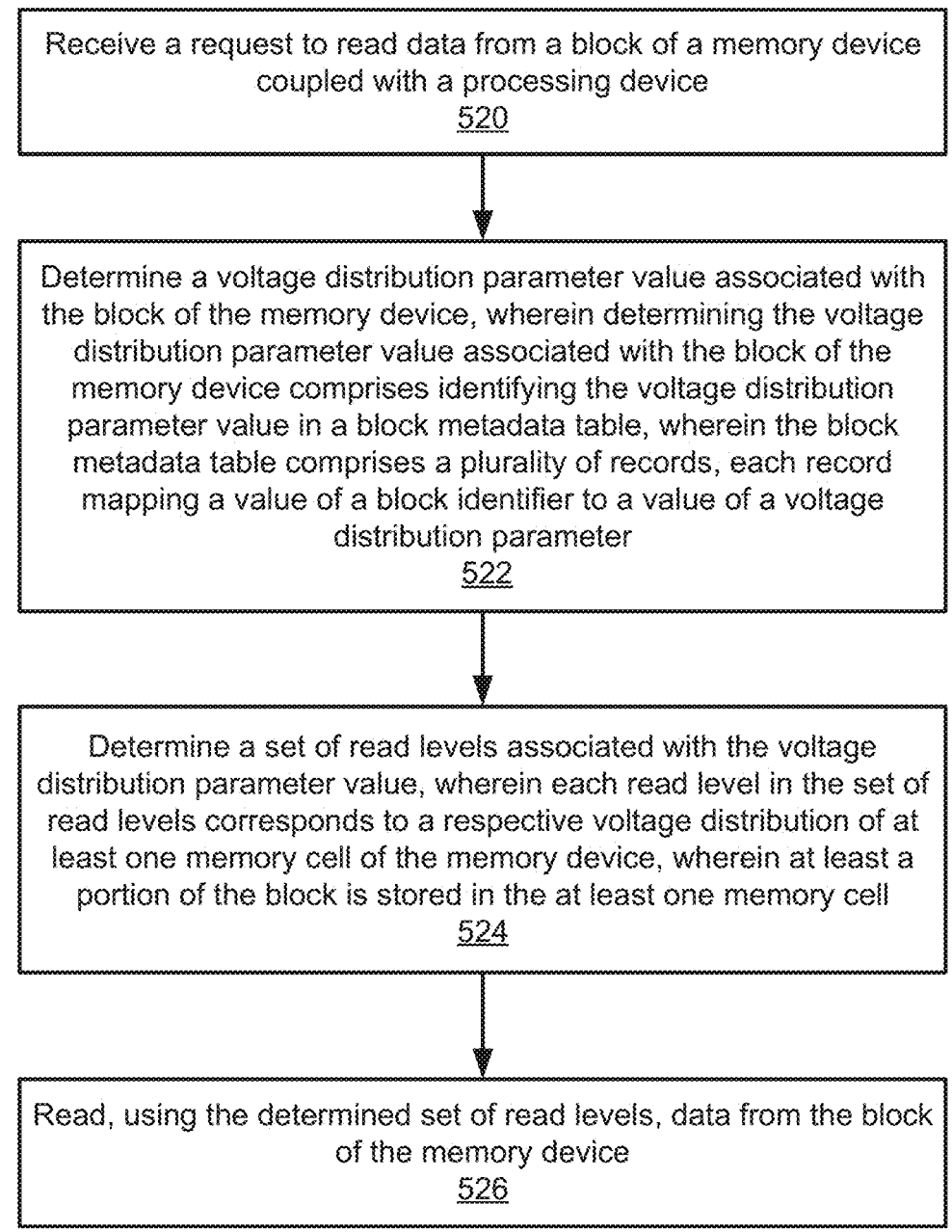
FIG. 5B is a flow diagram of an example method to determine read levels based on a distribution voltage of a block and read data using the determined read levels, in accordance with aspects of the present disclosure.

FIG. 5B is a flow diagram of an example method 501 to determine read levels based on a distribution voltage of a block and read data using the determined read levels, in accordance with aspects of the present disclosure. The method 501 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 501 is performed by the read level manager component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 520, the processing device can receive a request to read data from a block of a memory device coupled with a processing device. At operation 522, the processing device can determine a voltage distribution parameter value associated with the block of the memory device, wherein determining the voltage distribution parameter value associated with the block of the memory device comprises identifying the voltage distribution parameter value in a block metadata table, wherein the block metadata table comprises a plurality of records, each record mapping a value of a block identifier to a value of a voltage distribution parameter. At operation 524, the processing device can determine a set of read levels associated with the voltage distribution parameter value, wherein each read level in the set of read levels corresponds to a respective voltage distribution of at least one memory cell of the memory device, wherein at least a portion of the block is stored in the at least one memory cell. At operation 526, the processing device can read, using the determined set of read levels, data from the block of the memory device.

Figure 5C:
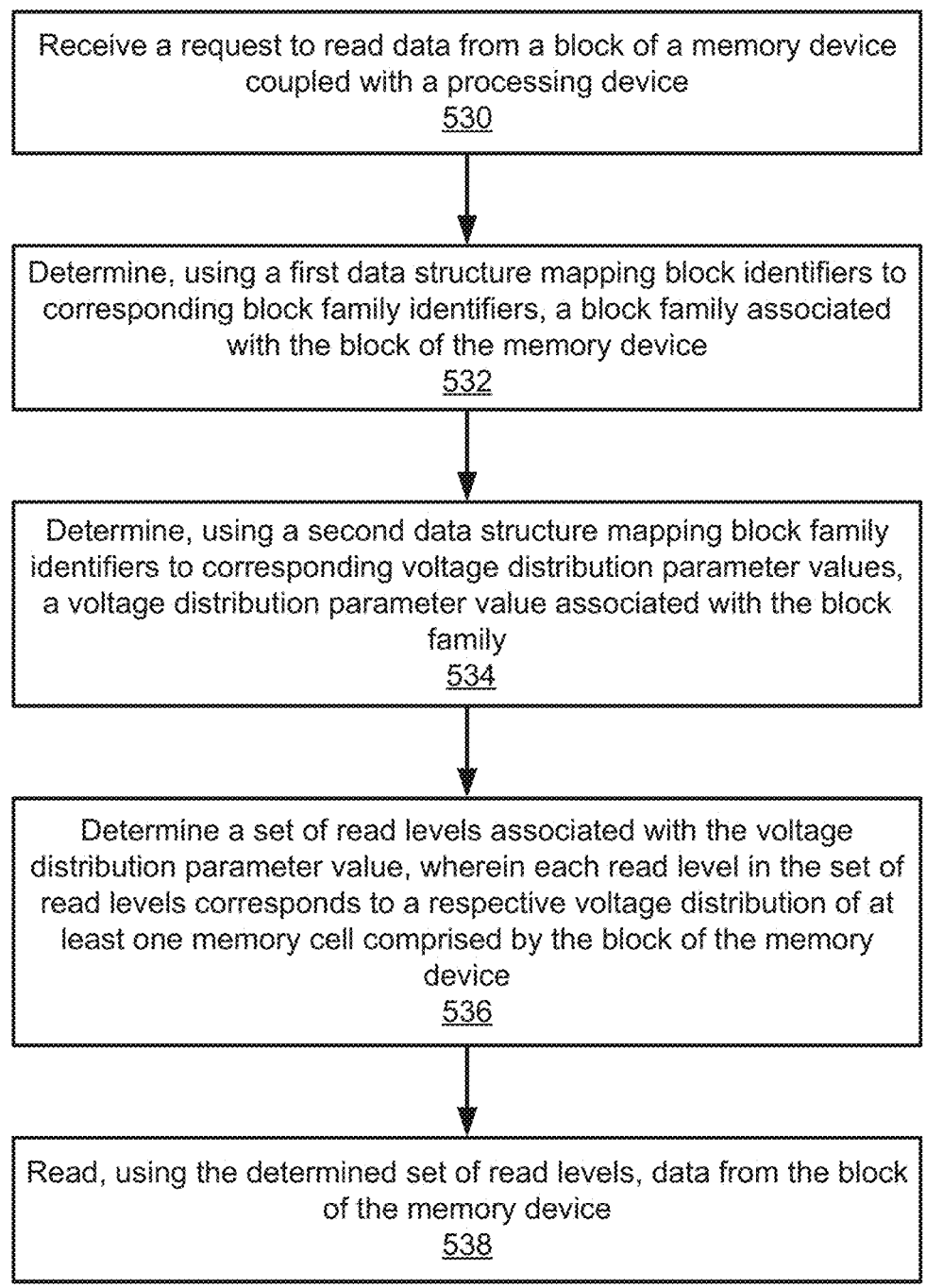
FIG. 5C is a flow diagram of an example method to determine read levels for a block based on a distribution voltage of a block family that includes the block and read data using the determined read levels, in accordance with aspects of the present disclosure.

FIG. 5C is a flow diagram of an example method 502 to determine read levels for a block based on a distribution voltage of a block family that includes the block and read data using the determined read levels, in accordance with aspects of the present disclosure. The method 502 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 502 is performed by the read level manager component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 530, the processing device can receive a request to read data from a block of a memory device coupled with a processing device. At operation 532, the processing device can determine, using a first data structure mapping block identifiers to corresponding block family identifiers, a block family associated with the block of the memory device. The first data structure mapping block identifiers to corresponding block family identifiers can be, for example, the block metadata table 464 of FIG. 4C. The block metadata table 464 can include a plurality of records, each record mapping one or more values of block identifiers to a value of a block family identifier. The block family associated with the block of the memory device can be determined using the first data structure by identifying, in the block metadata table 464, a block identifier value that corresponds to the block of the memory device. The block metadata table can associate the block identifier value with a block family identifier value, and the determined block family can correspond to the block family identifier value. As another example, the first data structure can map block identifier ranges to corresponding distribution voltages, as described above with respect to the block metadata table 484 of FIG. 4D.

At operation 534, the processing device can determine, using a second data structure mapping block family identifiers to corresponding voltage distribution parameter values, a voltage distribution parameter value associated with the block family. The second data structure can map block family identifiers to corresponding voltage distribution parameter values and can be, for example, the block family metadata table 466 of FIG. 4C. The block family metadata table 466 can include a plurality of records, each record mapping a value of a block family identifier to a value of a voltage distribution parameter. The voltage distribution parameter value can be, for example, a voltage value that is included in the particular voltage distribution of the memory cell, and determining the voltage distribution parameter value include determining a median, mean, or mode of the identified voltage distribution.

The voltage distribution parameter value associated with the block family can be determined by identifying, in the block family metadata table 466, a block family identifier value that corresponds to the block family. The voltage distribution parameter value can correspond to the block family identifier value in the block metadata table.

If the block family metadata table 466 does not include an association between the block family identifier value and a corresponding voltage distribution parameter value, then, at operation 532, the processing device can identify a particular voltage distribution of the memory cell(s) by sampling the memory cell(s) at one or more voltage levels and determine the voltage distribution parameter value based on the particular voltage distribution of the at least one memory cell. The processing device can then store the voltage distribution parameter value in the block family metadata table 466 in association with the block family identifier value.

At operation 536, the processing device can determine a set of read levels associated with the voltage distribution parameter value, wherein each read level in the set of read levels corresponds to a respective voltage distribution of at least one memory cell comprised by the block of the memory device. At operation 538, the processing device can read, using the determined set of read levels, data from the block of the memory device.

At one or more additional operations (not shown), the processing device can perform a plurality of calibration scan iterations. Each calibration scan iteration can include identifying at least one second block of the memory device that satisfies one or more calibration criteria, and performing a calibration operation for each identified second block that satisfies the calibration criteria. The calibration operation can include determining a second voltage distribution parameter value based on the second block of the memory device, determining, using the first data structure mapping block identifiers to corresponding block family identifiers, a second block family identifier associated with the second block of the memory device, and storing the determined second voltage distribution parameter value in the second data structure in association with the second block family identifier. The second block of the memory device that satisfies the calibration criteria can be, for example, a block for which a time since program has increased by at least a threshold amount since a previous calibration operation was performed on the at least one block.

Figure 5D:
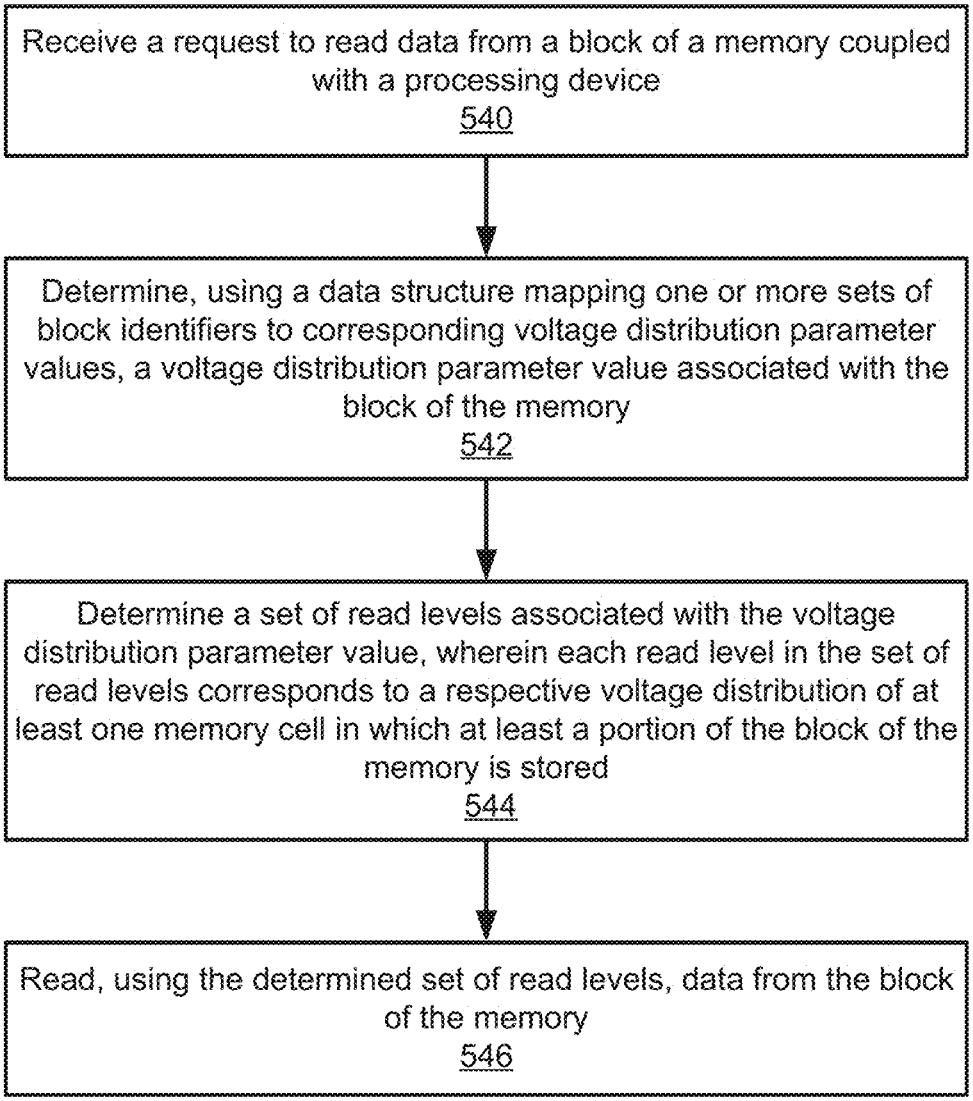
FIG. 5D is a flow diagram of an example method to determine read levels based on a distribution voltage of a block and read data using the determined read levels, in accordance with aspects of the present disclosure.

FIG. 5D is a flow diagram of an example method 503 to determine read levels based on a distribution voltage of a block and read data using the determined read levels, in accordance with aspects of the present disclosure. The method 503 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 503 is performed by the read level manager component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 540, the processing device can receive a request to read data from a block of a memory coupled with a processing device. At operation 542, the processing device can determine, using a data structure mapping one or more sets of block identifiers to corresponding voltage distribution parameter values, a voltage distribution parameter value associated with the block of the memory. The data structure mapping one or more sets of block identifiers to corresponding voltage distribution parameter values can be, for example, the block metadata table 484 of FIG. 4D. The block metadata table 484 can include a plurality of records, each record mapping a set of block identifiers to a corresponding voltage distribution parameter value. The voltage distribution parameter value associated with the block of the memory can be determined using the data structure by identifying, in the block metadata table, a set of block identifiers that includes a block identifier of the block of the memory, wherein the identified set of block identifiers corresponds to the voltage distribution parameter value associated with the block of the memory. Each set of block identifiers can be specified as a range of block identifiers, the range comprising a first block identifier and a second block identifier.

At operation 544, the processing device can determine a set of read levels associated with the voltage distribution parameter value, wherein each read level in the set of read levels corresponds to a respective voltage distribution of at least one memory cell comprised by the block of the memory. At operation 538, the processing device can read, using the determined set of read levels, data from the block of the memory device.

Figure 6:
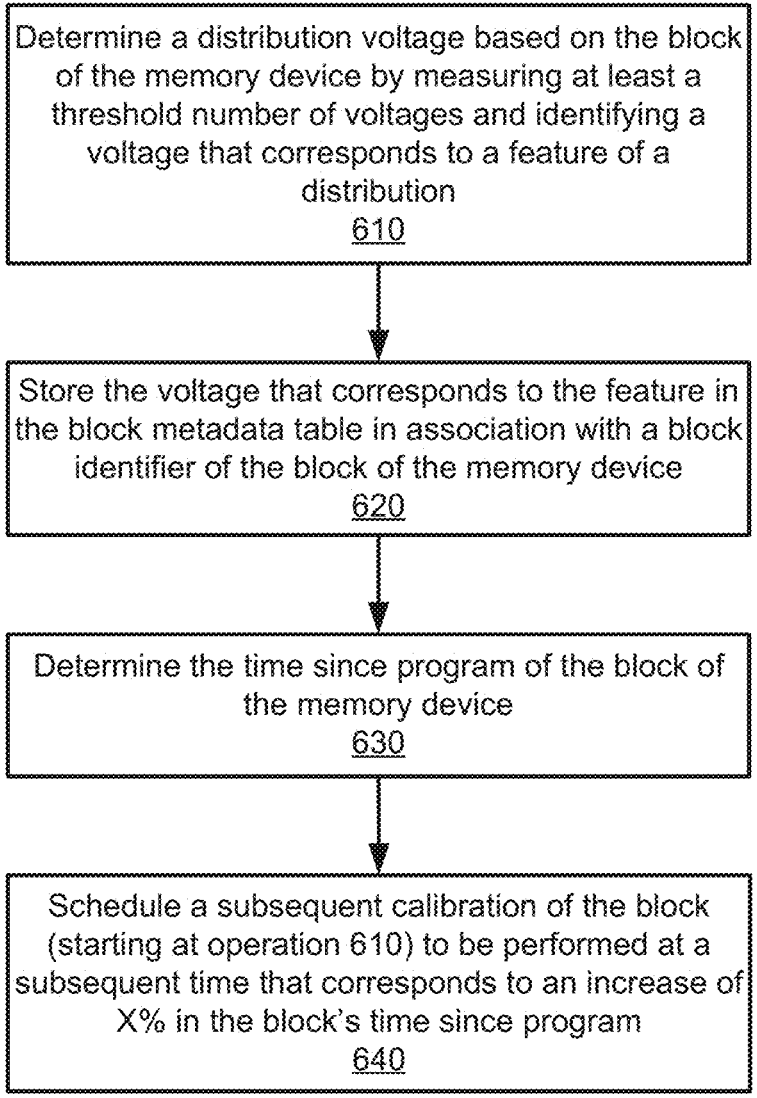
FIG. 6 is a flow diagram of an example method to perform a distribution voltage calibration scan that determines distribution voltages of blocks and stores the distribution voltages in a block metadata table, in accordance with aspects of the present disclosure.

FIG. 6 is a flow diagram of an example method 600 to perform a distribution voltage calibration scan that determines distribution voltages of blocks and stores the distribution voltages in a block metadata table, in accordance with aspects of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the read level manager component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, the processing device can determine a distribution voltage based on the block of the memory device by measuring at least a threshold number of voltages and identifying a voltage that corresponds to a feature of the distribution. The feature of the distribution may be, for example, a peak of the distribution. The distribution voltage may be determined as a function or characteristic of the distribution, such as a mean, median, mode, or other characteristic of the distribution. At operation 620, the processing device can store the voltage that corresponds to the feature in the block metadata table in association with a block identifier of the block of the memory device.

At operation 630, the processing device can determine the time since program (TSP) of the block of the memory device. The determined time is referred to in the description of operation 640 below as a variable named "TSP" having associated time units. The time units may be, e.g., seconds. At operation 640, the processing device can schedule a subsequent calibration of the block (that is, a subsequent execution of method 600 starting at operation 610) to be performed at a subsequent time that corresponds to an increase of X % in the block's time since program relative to the current time. The current time can be, for example, the time at which operation 640 is executed. For example, the subsequent time can correspond to an increase of 50% in the block's time since program (TSP), in which case the subsequent time can be determined as the current time+ 0.50*TSP, or 0.50*TSP time units (e.g., seconds) in the future. The value X can be any desired numeric percentage.

Figure 7:
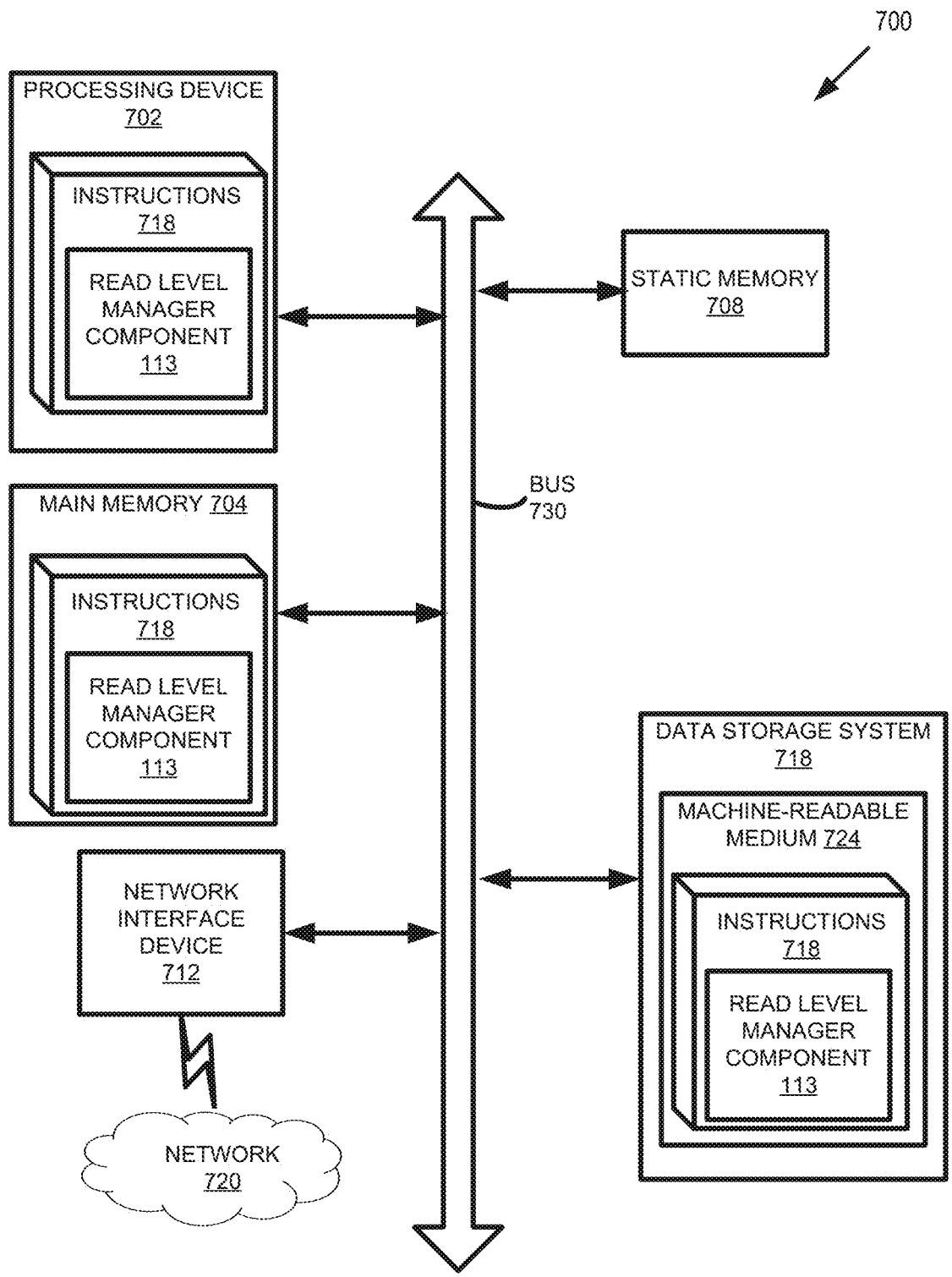
FIG. 7 is a block diagram of an example computer system in which embodiments of the present disclosure can operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the read level manager component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or RDRAM, etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to a read level manager component (e.g., the read level manager component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
receiving, by a processing device, a request to read data from a block of a memory device coupled with the processing device;
identifying a block family associated with the block of the memory device;

identifying a voltage distribution parameter value associated with the block family, wherein the voltage distribution parameter value is based on a feature of a corresponding voltage distribution associated with a plurality of memory cells of the block family; and determining a set of read levels associated with the voltage distribution parameter value, wherein each read level in the set of read levels corresponds to a respective voltage distribution of at least one memory cell comprised by the block of the memory device.

2. The method of claim 1, wherein the block family is identified using a data structure that maps block identifiers to corresponding block family identifiers.

3. The method of claim 2, wherein the data structure that maps block identifiers to corresponding block family identifiers comprises a block metadata table, wherein the block metadata table comprises a plurality of records, each record mapping one or more block identifiers to a block family identifier, and wherein determining, using the data structure, the block family associated with the block of the memory device further comprises:

identifying, in the block metadata table, a block identifier of the block of the memory device, wherein the block metadata table associates the block identifier with a block family identifier, and the block family corresponds to the block family identifier.

4. The method of claim 1, wherein the voltage distribution parameter value is identified using a data structure that maps block family identifiers to corresponding voltage parameter values.

5. The method of claim 4, wherein the data structure that maps block family identifiers to corresponding voltage distribution parameter values comprises a block family metadata table, wherein the block family metadata table comprises a plurality of records, each record mapping a value of a block family identifier to a value of a voltage distribution parameter, and determining, using the data structure, the voltage distribution parameter value associated with the block family comprises:

identifying, in the block family metadata table, a block family identifier value that corresponds to the block family, wherein the voltage distribution parameter value corresponds to the block family identifier value in the block family metadata table.

6. The method of claim 5, wherein determining, using the data structure, the voltage distribution parameter value associated with the block family further comprises:

determining whether the block family metadata table includes an association between the block family identifier value that corresponds to the block family and a corresponding voltage distribution parameter value; and responsive to determining that the block family metadata table does not include an association between the block family identifier value and a corresponding voltage distribution parameter value:

identifying a particular voltage distribution of the at least one memory cell by sampling the at least one memory cell at one or more voltage levels, determining the voltage distribution parameter value based on the particular voltage distribution of the at least one memory cell, and storing the voltage distribution parameter value in the block family metadata table in association with the block family identifier value.

7. The method of claim 1, wherein determining the set of read levels associated with the voltage distribution parameter value comprises:

determining the set of read levels using a voltage mapping table, wherein the voltage mapping table comprises a plurality of records, each record mapping a value of a voltage distribution parameter to a set of values of read levels.

8. The method of claim 7, wherein determining the set of read levels using a voltage mapping table comprises:

determining whether the voltage mapping table includes the voltage distribution parameter value; and responsive to determining that the voltage mapping table includes the voltage distribution parameter value, retrieving the set of read levels from the voltage mapping table, wherein the voltage mapping table associates the voltage distribution parameter value with the set of read levels.

9. The method of claim 1, further comprising:

identifying at least one second block of the memory device that satisfies one or more calibration criteria;

performing a calibration operation for each identified second block that satisfies the calibration criteria, wherein performing the calibration operation comprises:

determining a second voltage distribution parameter value based on the second block of the memory device;

determining, using a data structure that maps block identifiers to corresponding block family identifiers, a second block family identifier associated with the second block of the memory device; and storing the second voltage distribution parameter value in a data structure that maps block family identifiers to corresponding voltage distribution parameter values, wherein the second voltage distribution parameter value is stored in the data structure in association with the second block family identifier.

10. The method of claim 9, wherein the at least one second block of the memory device that satisfies one or more calibration criteria comprises at least one block for which a time since program has increased by at least a threshold amount since a previous calibration operation was performed on the at least one block.

11. The method of claim 1, further comprising:

reading, using the determined set of read levels, data from the block of the memory device.

12. The method of claim 11, wherein reading, using the determined set of read levels, data from the block comprises:

measuring a voltage of the at least one memory cell; and identifying a logical level to which the voltage corresponds, wherein identifying the logical level comprises comparing the measured voltage to one or more of the read levels, wherein the data read from the block comprises the identified logical level.

13. A system comprising:

a memory; and a processing device communicably coupled to the memory, the processing device to perform operations comprising:

receiving a request to read data from a block of the memory;

determining a voltage distribution parameter value associated with the block of the memory, wherein the voltage distribution parameter value is based on a feature of a corresponding voltage distribution associated with a plurality of memory cells of the block; and determining a set of read levels associated with the voltage distribution parameter value, wherein each read level in the set of read levels corresponds to a respective voltage distribution of at least one memory cell comprised by the block of the memory.

14. The system of claim 13, wherein the voltage distribution parameter value is determined using a data structure that maps one or more sets of block identifiers to corresponding voltage distribution parameter values.

15. The system of claim 14, wherein the data structure that maps block identifiers to corresponding voltage distribution parameter values comprises a block metadata table, wherein the block metadata table comprises a plurality of records, each record mapping a set of block identifiers to a corresponding voltage distribution parameter value, and wherein determining, using the data structure, the voltage distribution parameter value associated with the block of the memory comprises:

identifying, in the block metadata table, a set of block identifiers that includes a block identifier of the block of the memory, wherein the identified set of block identifiers corresponds to the voltage distribution parameter value associated with the block of the memory.

16. The system of claim 15, wherein determining, using a data structure mapping one or more sets of block identifiers to corresponding voltage distribution parameter values, a voltage distribution parameter value associated with the block of the memory comprises:

determining that the block metadata table does not include an association between a set of block identifiers that includes the block identifier of the block and a voltage distribution parameter value;

identifying a particular voltage distribution of the at least one memory cell by sampling the at least one memory cell at one or more voltage levels, determining the voltage distribution parameter value based on the particular voltage distribution of the at least one memory cell, and storing the voltage distribution parameter value in the block metadata table in association with the set of block identifiers that includes the block identifier of the block.

17. The system of claim 13, wherein determining the set of read levels associated with the voltage distribution parameter value comprises:

determining the set of read levels using a voltage mapping table, wherein the voltage mapping table comprises a plurality of records, each record mapping a value of a voltage distribution parameter to a set of values of read levels.

18. A non-transitory machine-readable storage medium storing instructions that cause a processing device to perform operations comprising:

receiving, a request to read data from a block of a memory device coupled with the processing device;

identifying a block family associated with the block of the memory device;

identifying a voltage distribution parameter value associated with the block family, wherein the voltage distribution parameter value is based on a feature of a corresponding voltage distribution associated with a plurality of memory cells of the block family; and determining a set of read levels associated with the voltage distribution parameter value, wherein each read level in the set of read levels corresponds to a respective voltage distribution of at least one memory cell comprised by the block of the memory device.

19. The non-transitory machine-readable storage medium of claim 18, wherein the block family is identified using a data structure that maps block identifiers to corresponding block family identifiers.

20. The non-transitory machine-readable storage medium of claim 18, wherein the voltage distribution parameter value is identified using a data structure that maps block family identifiers to corresponding voltage parameter values.

* * * * *